(12) United States Patent
Sridharan et al.

(10) Patent No.: US 11,984,418 B2
(45) Date of Patent: May 14, 2024

(54) METHOD OF FORMING BRASS-COATED METALS IN FLIP-CHIP REDISTRIBUTION LAYERS

(71) Applicant: Texas Instruments Incorporated, Dallas, TX (US)

(72) Inventors: Vivek Swaminathan Sridharan, Dallas, TX (US); Christopher Daniel Manack, Flower Mound, TX (US); Nazila Dadvand, Sunnyvale, CA (US); Salvatore Frank Pavone, Houston, TX (US); Patrick Francis Thompson, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 2 days.

(21) Appl. No.: 17/884,284

(22) Filed: Aug. 9, 2022

(65) Prior Publication Data

US 2022/0384375 A1    Dec. 1, 2022

Related U.S. Application Data

(62) Division of application No. 16/721,546, filed on Dec. 19, 2019, now Pat. No. 11,410,947.

(51) Int. Cl.
   *H01L 23/00*    (2006.01)
(52) U.S. Cl.
   CPC .............. *H01L 24/05* (2013.01); *H01L 24/11* (2013.01); *H01L 24/13* (2013.01); *H01L 2224/0231* (2013.01); *H01L 2224/02317* (2013.01); *H01L 2224/02331* (2013.01); *H01L 2224/0239* (2013.01); *H01L 2224/024* (2013.01); *H01L 2224/0345* (2013.01); *H01L 2224/03462* (2013.01); *H01L 2224/03502* (2013.01); *H01L 2224/03848* (2013.01); *H01L 2224/0401* (2013.01); *H01L 2224/05147* (2013.01); *H01L 2224/05569* (2013.01); *H01L 2224/05618* (2013.01); *H01L 2224/05647* (2013.01); *H01L 2224/11424* (2013.01); *H01L 2224/1145* (2013.01); *H01L 2224/11848* (2013.01); *H01L 2224/13026* (2013.01); *H01L 2224/13082* (2013.01); *H01L 2224/13147* (2013.01); *H01L 2224/13565* (2013.01);
   (Continued)

(58) Field of Classification Search
   None
   See application file for complete search history.

(56) References Cited

U.S. PATENT DOCUMENTS 5,633,047 A  *  5/1997  Brady ..................... C23C 18/50
                                                    257/E23.164
5,855,993 A  *  1/1999  Brady ................. H01L 21/2885
                                                    428/209

(Continued)

FOREIGN PATENT DOCUMENTS

CN            106356352 A  *  1/2017  ............. H01L 24/13

*Primary Examiner* — Scott B Geyer
(74) *Attorney, Agent, or Firm* — Dawn Jos; Frank D. Cimino

(57) ABSTRACT

A method for manufacturing a package includes positioning a copper layer above a die. A zinc layer is positioned on the copper layer. The zinc and copper layers are then heated to produce a brass layer, the brass layer abutting the copper layer. Further, a polymer layer is positioned abutting the brass layer.

13 Claims, 28 Drawing Sheets

(52) U.S. Cl.
CPC .............. *H01L 2224/1357* (2013.01); *H01L 2224/13618* (2013.01); *H01L 2224/13647* (2013.01); *H01L 2924/0132* (2013.01)

(56) References Cited

U.S. PATENT DOCUMENTS

| | | | |
|---|---|---|---|
| 2005/0275096 A1* | 12/2005 | Zeng | H01L 24/16 257/772 |
| 2008/0223906 A1* | 9/2008 | Choi | H01L 24/11 228/56.3 |
| 2012/0049356 A1 | 3/2012 | Migita et al. | |
| 2014/0035127 A1 | 2/2014 | Hirtreiter et al. | |
| 2015/0076699 A1* | 3/2015 | Sasaki | H01L 24/04 257/762 |
| 2016/0190078 A1* | 6/2016 | Love | H01L 24/03 257/737 |
| 2016/0379949 A1 | 12/2016 | Tseng et al. | |
| 2017/0309583 A1* | 10/2017 | Konrath | H01L 29/45 |
| 2017/0372998 A1 | 12/2017 | Chen | |
| 2018/0047689 A1* | 2/2018 | Hua | H01L 24/11 |
| 2018/0166618 A1 | 6/2018 | Kim et al. | |
| 2020/0248329 A1 | 8/2020 | Dadvand | |

\* cited by examiner

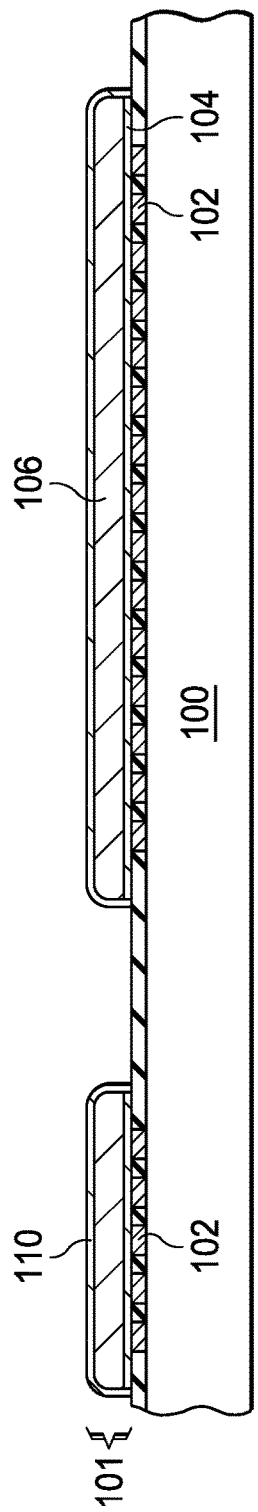
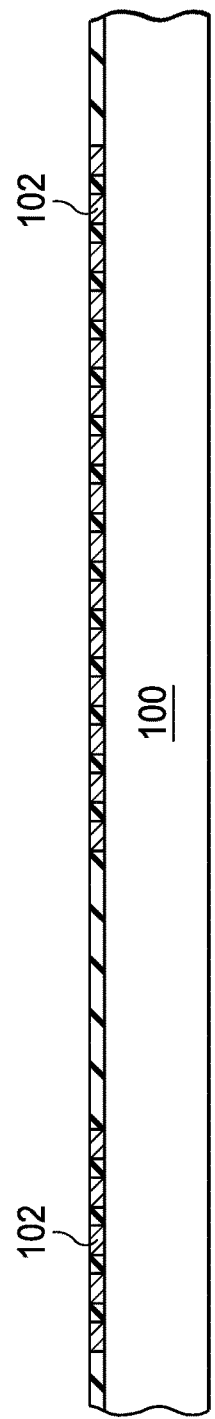
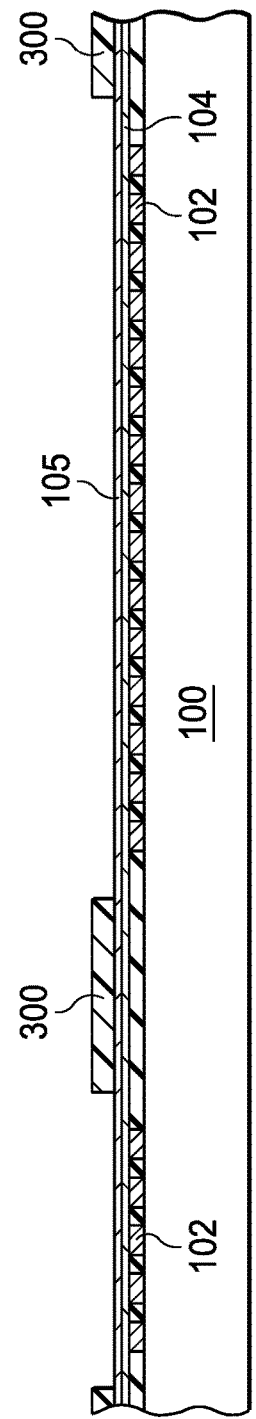

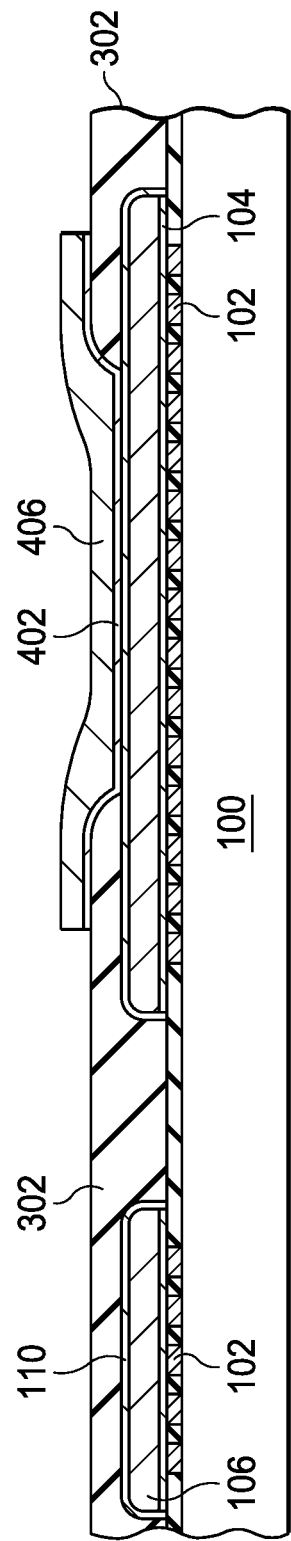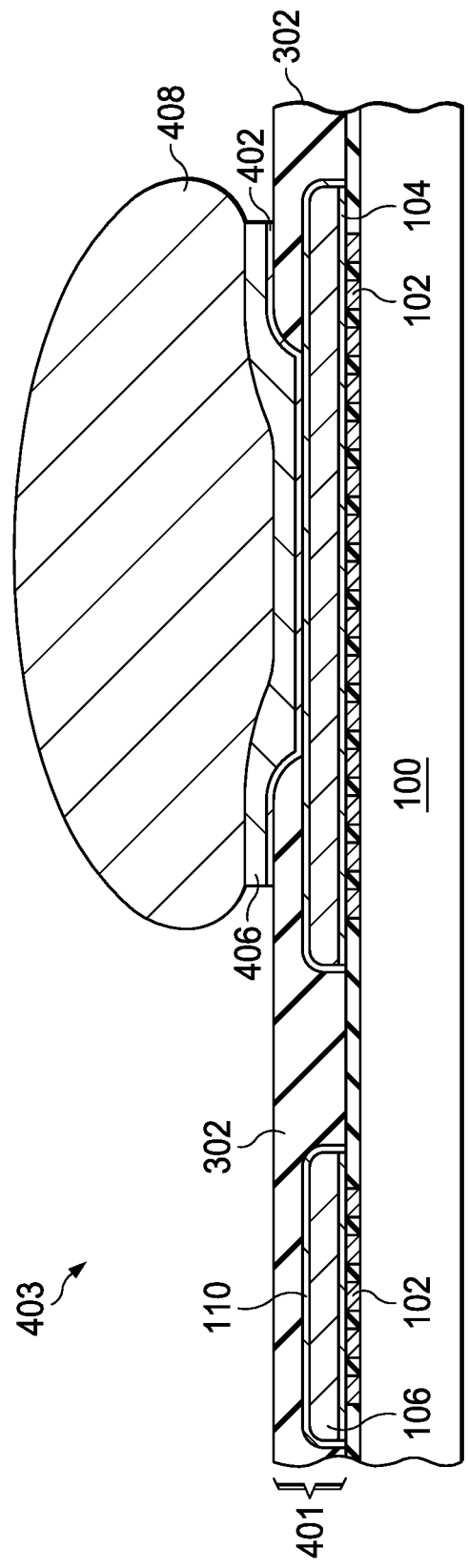

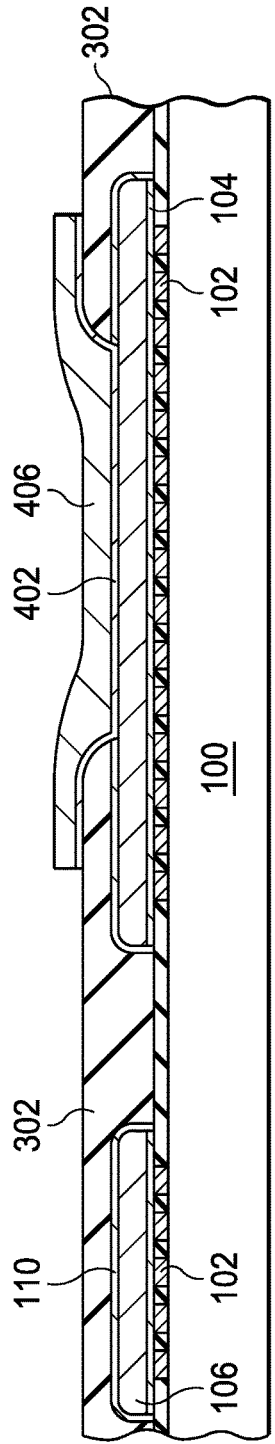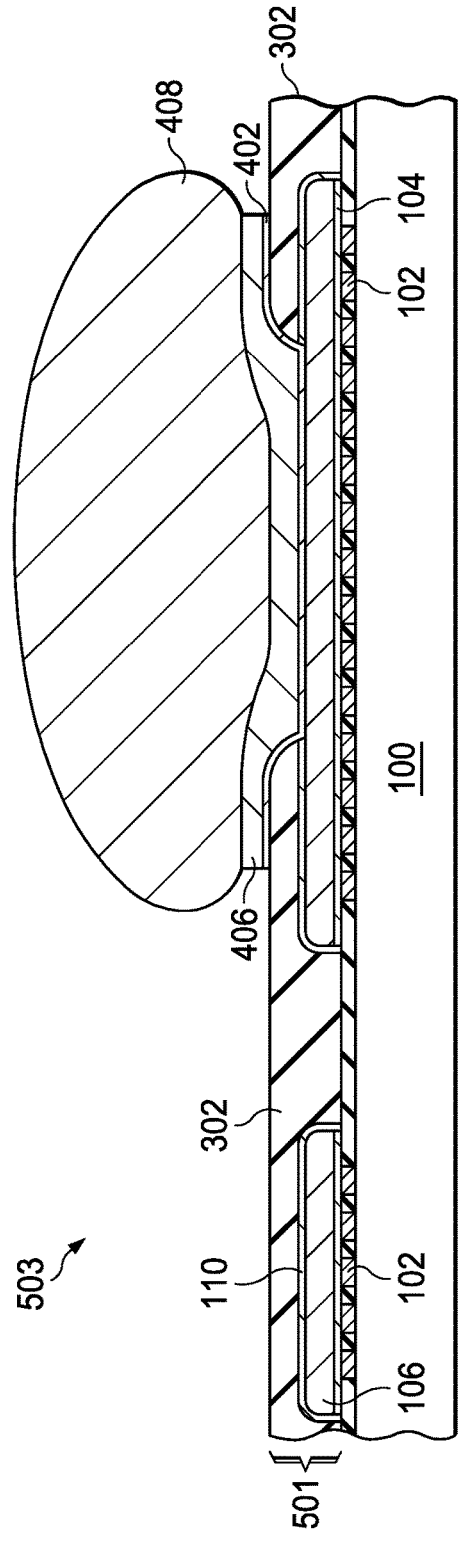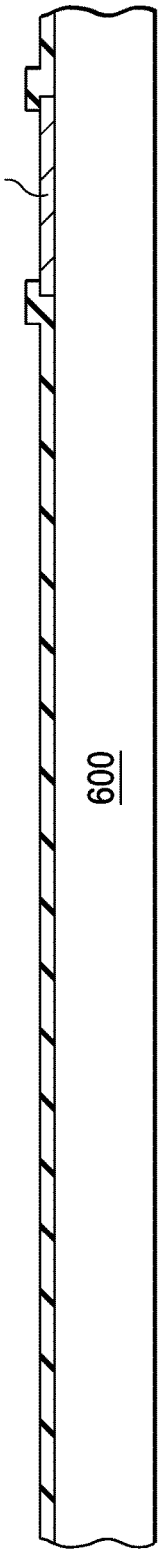

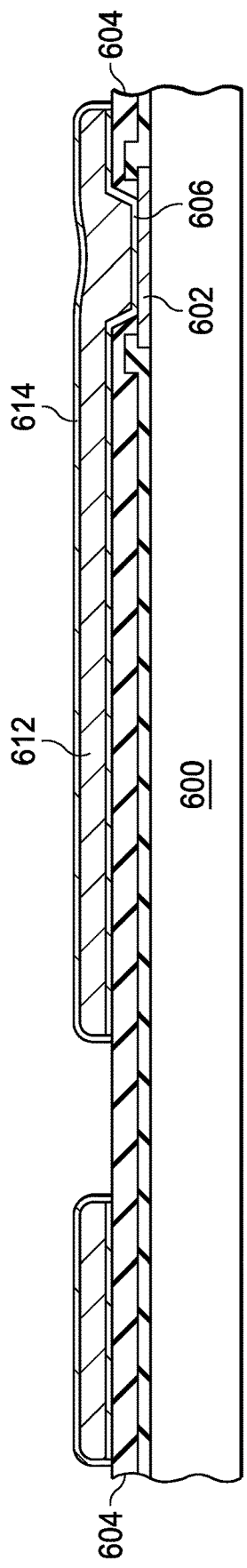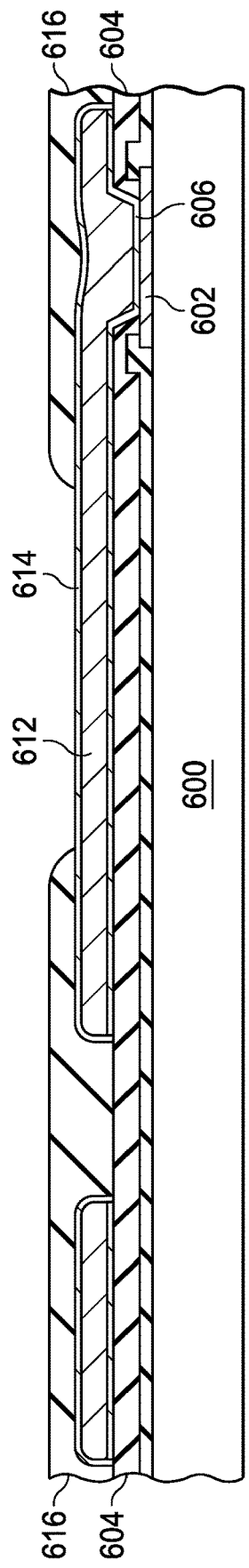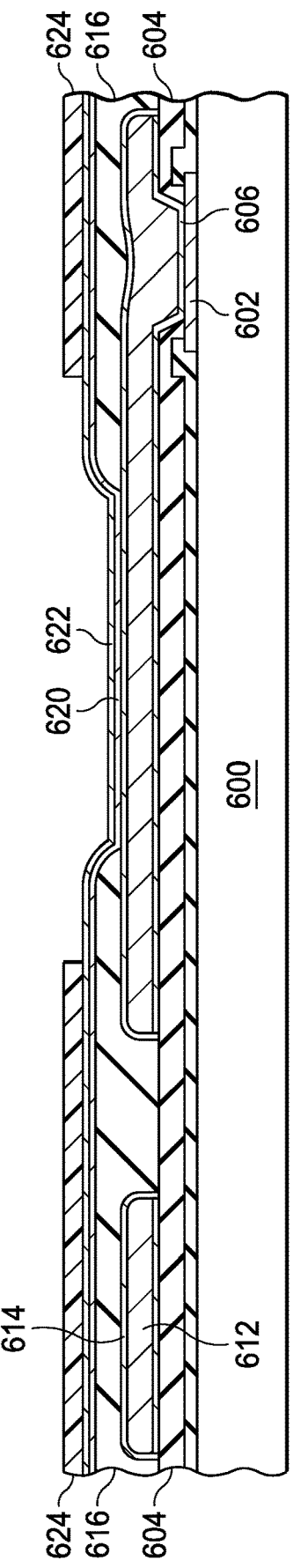

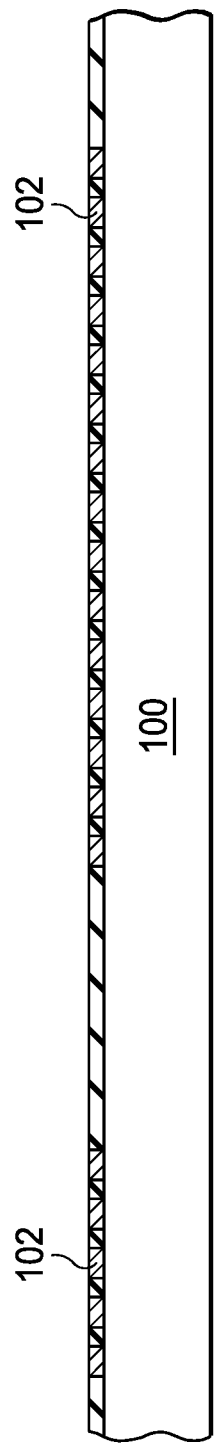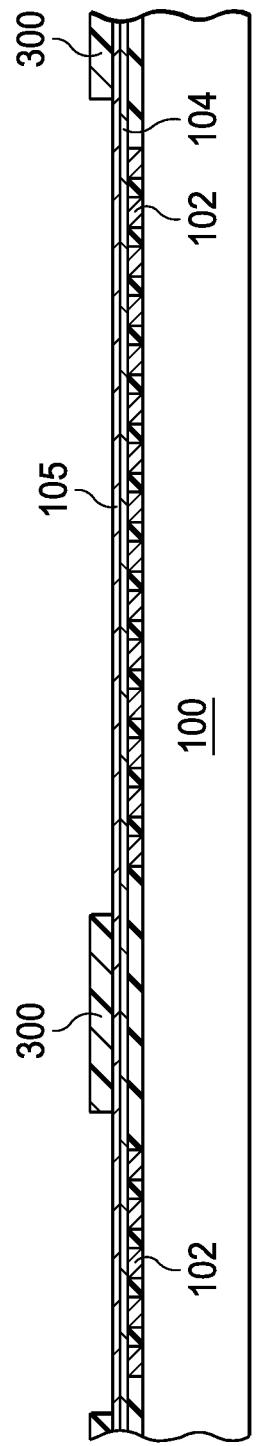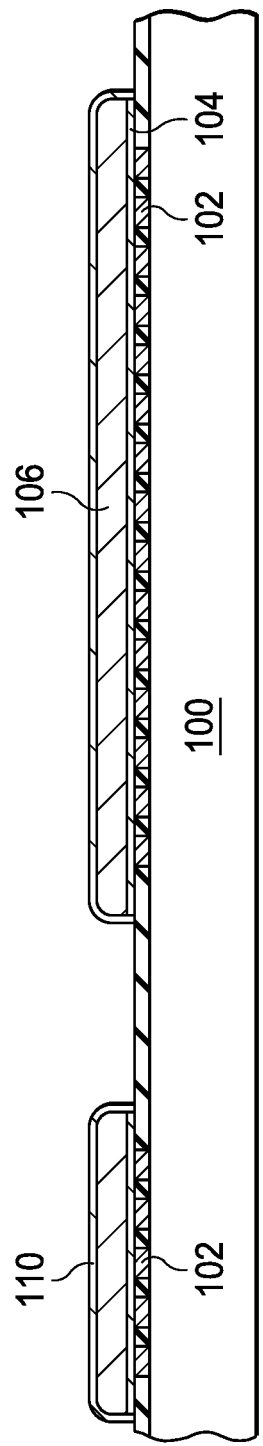

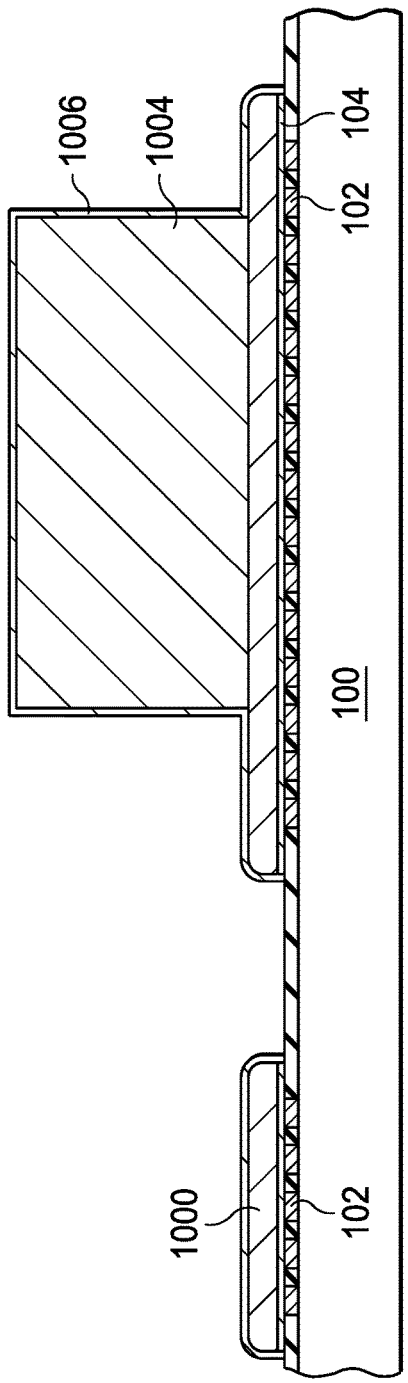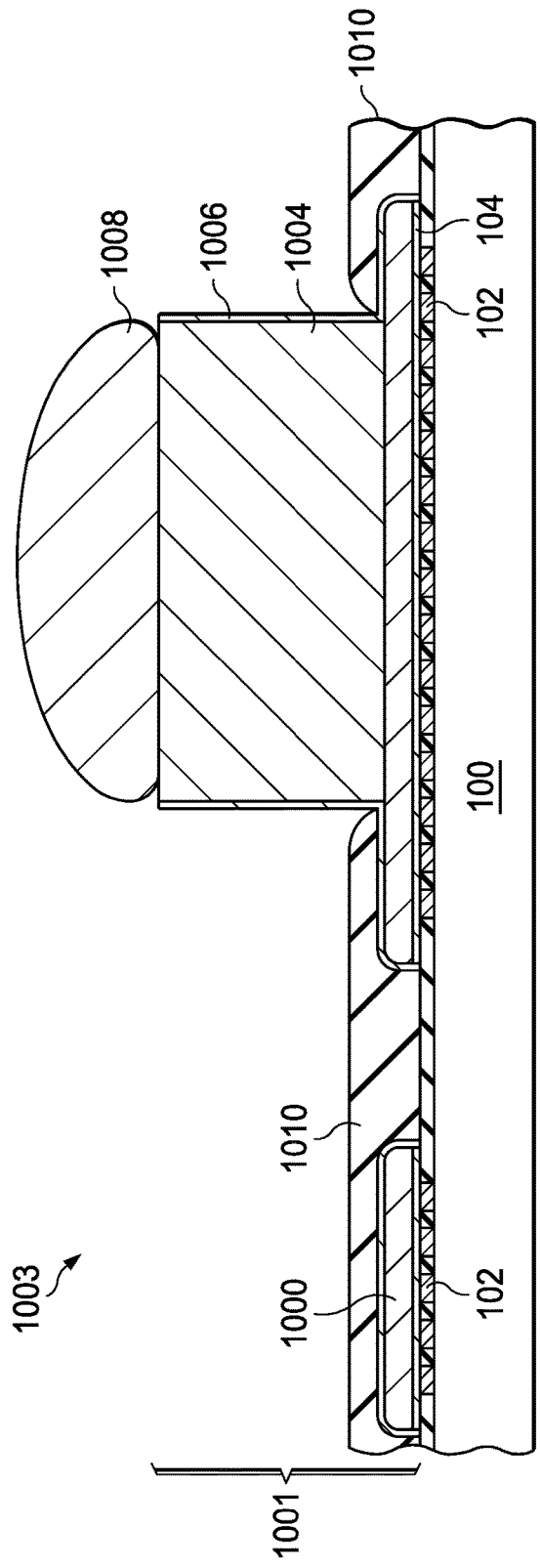
FIG. 10F
FIG. 10G

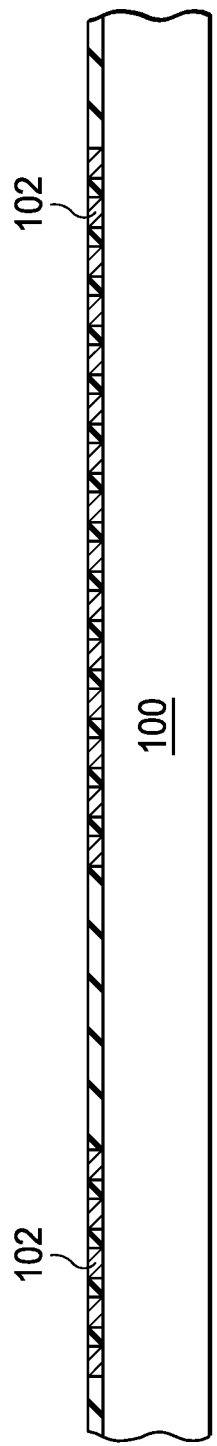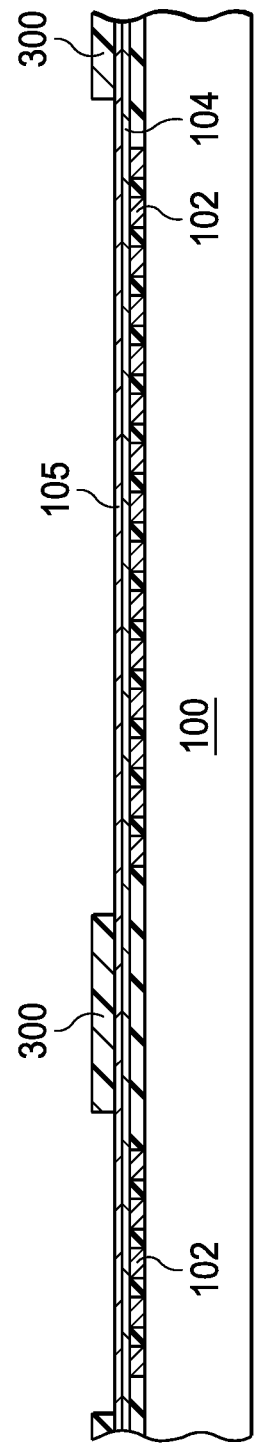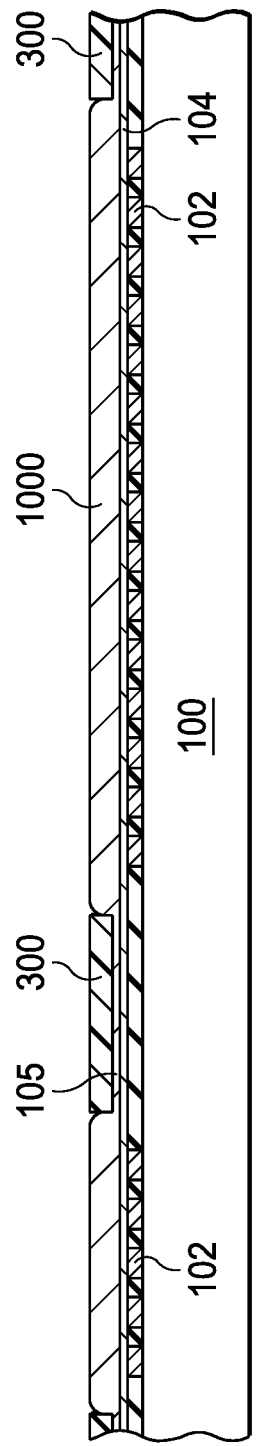

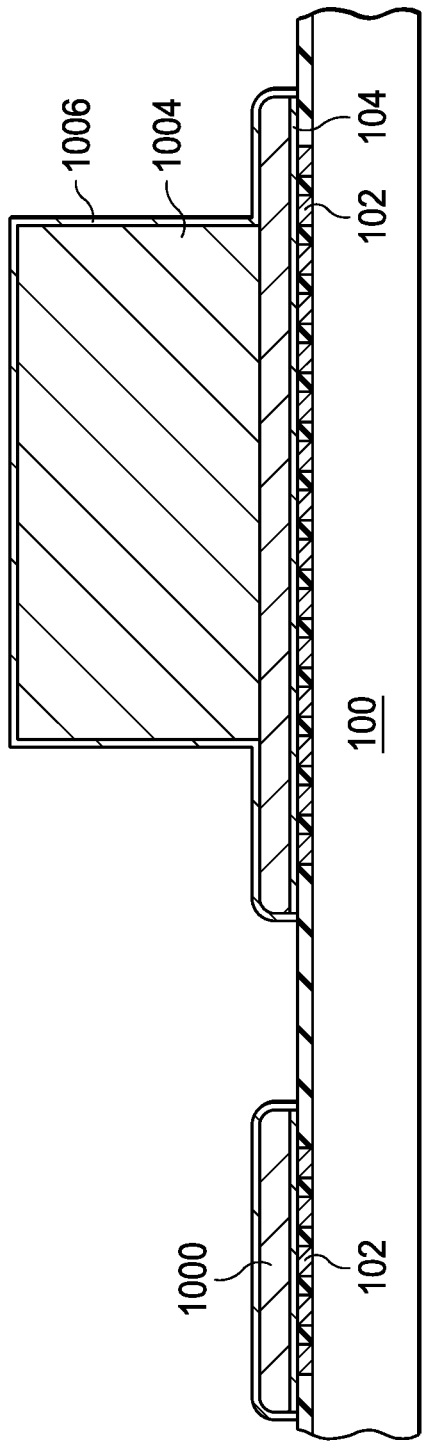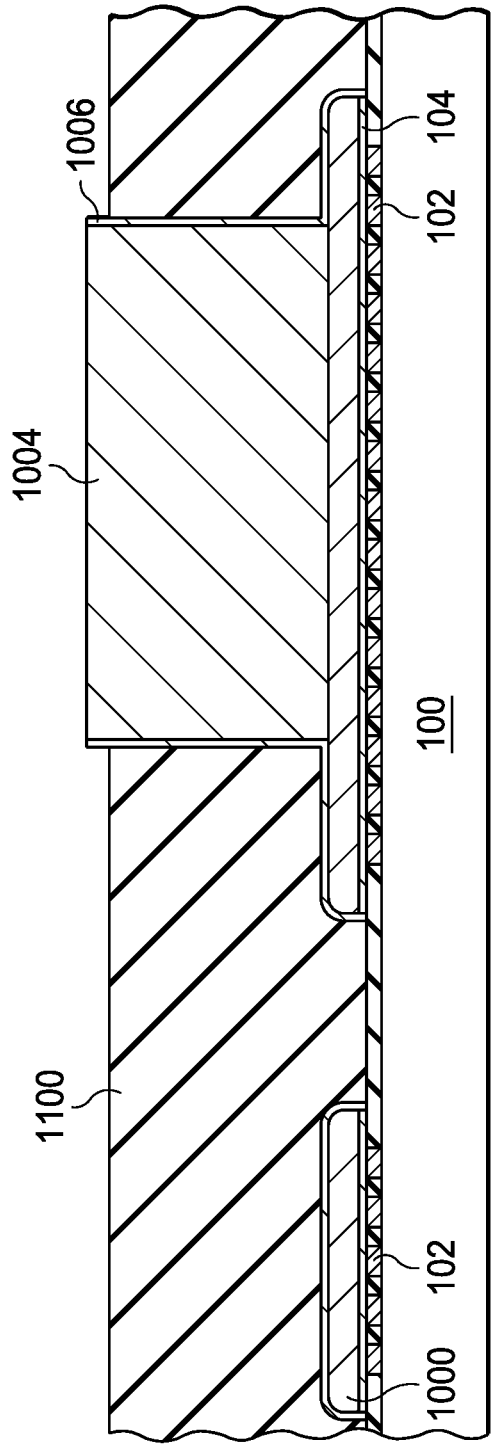
FIG. 11F
FIG. 11G

METHOD OF FORMING BRASS-COATED METALS IN FLIP-CHIP REDISTRIBUTION LAYERS

This application is a division of patent application Ser. No. 16/721,546, filed Dec. 19, 2019, the contents of all of which are herein incorporated by reference in its entirety.

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The assembly is later covered in a mold compound, such as epoxy, to protect the assembly from potentially damaging heat, physical trauma, moisture, and other deleterious factors. The finished assembly is called a semiconductor package or, more simply, a package. The leads are exposed to surfaces of the package and are used to electrically couple the packaged chip to devices outside of the chip.

However, other types of packages, such as flip-chip packages, are configured differently than described above. Flip-chip packages include a die, metallic bumps (e.g., solder bumps), and a redistribution layer (RDL) that interfaces between the die and the metallic bumps so that signals are routed appropriately between the bumps and the active circuitry formed on the die. Examples of such flip-chip packages include wafer chip scale packages (WCSPs).

SUMMARY

In some examples, a package comprises a die and a redistribution layer coupled to the die. The redistribution layer comprises a metal layer, a brass layer abutting the metal layer, and a polymer layer abutting the brass layer.

In some examples, a package comprises a die having a bond pad and a redistribution layer coupled to the die. The redistribution layer comprises a polymer layer abutting the die, and a metal layer at least partially positioned within the polymer layer, the metal layer abutting a brass layer.

In some examples, a method for manufacturing a package comprises: positioning a copper layer above a die; positioning a zinc layer on the copper layer; heating the zinc and copper layers to produce a brass layer, the brass layer abutting the copper layer; and positioning a polymer layer abutting the brass layer.

BRIEF DESCRIPTION OF THE DRAWINGS

For a detailed description of various examples, reference will now be made to the accompanying drawings in which:

FIGS. 2A-2C depict an illustrative technique to coat a copper layer in an RDL with brass, in accordance with various examples.

FIGS. 3A-3E depict an illustrative process flow technique to fabricate RDLs that include brass-coated copper layers, in accordance with various examples.

FIGS. 4A-4G depict an illustrative process flow technique to fabricate RDLs that include brass-coated copper layers, in accordance with various examples.

FIGS. 5A-5H depict an illustrative process flow technique to fabricate RDLs that include brass-coated copper layers, in accordance with various examples.

FIGS. 6A-6F depict an illustrative process flow technique to fabricate RDLs that include brass-coated copper layers, in accordance with various examples.

FIGS. 7A-7H depict an illustrative process flow technique to fabricate RDLs that include brass-coated copper layers, in accordance with various examples.

FIGS. 9A-9F depict an illustrative process flow technique to fabricate RDLs that include brass-coated copper layers, in accordance with various examples.

FIGS. 10A-10G depict an illustrative process flow technique to fabricate RDLs that include brass-coated copper layers, in accordance with various examples.

FIGS. 11A-11H depict an illustrative process flow technique to fabricate RDLs that include brass-coated copper layers, in accordance with various examples.

DETAILED DESCRIPTION

As explained above, certain types of packages include a die, multiple metallic bumps, and a redistribution layer (RDL) positioned in between the die and the bumps to properly route signals between the bumps and active circuitry on the die. Copper is one metal that is commonly used in RDLs to establish electrical pathways between the bumps and the active circuitry on the die. The RDLs often include a passivation layer, such as a polyimide, to protect the copper from corrosion. However, when the passivation layer is compromised, the copper layers are exposed to moisture, temperature fluctuations, and external contaminants (e.g., chlorine and potassium present in solder flux). Such exposure causes the copper layers to undergo electrolytic dissolution, thereby damaging the functional integrity of the package.

This disclosure describes a technique whereby the copper layers in RDLs are protected from exposure to deleterious influences, such as the moisture, temperature fluctuations, and external contaminants mentioned above. Specifically, this disclosure describes various examples of packages having RDLs with brass-coated copper layers and passivation layers abutting the brass layers. The passivation layer protects the copper layer from the deleterious influences described above, but in case the passivation layer is compromised, the brass layer prevents damage to the copper layer. In this way, the functional integrity of the package remains intact.

This disclosure first describes illustrative techniques that may be used to coat RDL copper layers with brass. FIGS. 1A-1D and 2A-2C depict such techniques. The remainder of the disclosure describes a variety of illustrative process flow techniques that may be used to fabricate RDLs that incorporate the aforementioned brass-coating techniques. FIG. 3A and following depict such techniques.

Figure 1A:
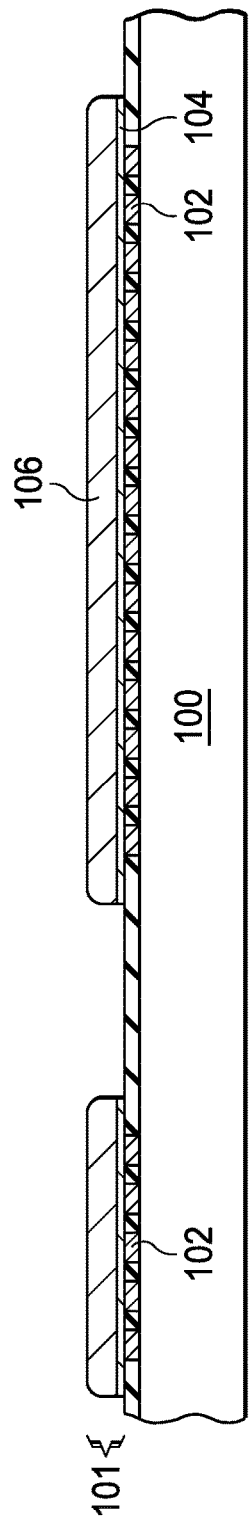
FIGS. 1A-1D depict an illustrative technique to coat a copper layer in a redistribution layer (RDL) with brass, in accordance with various examples.
Figure 1B:
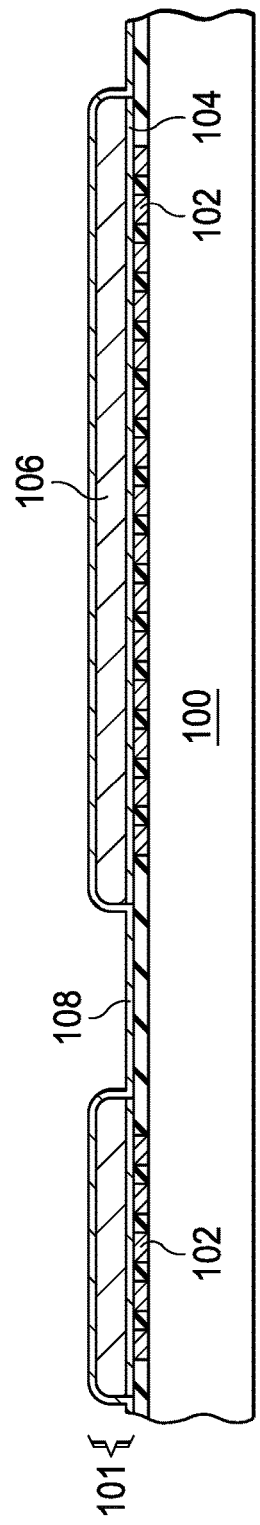
Figure 1C:
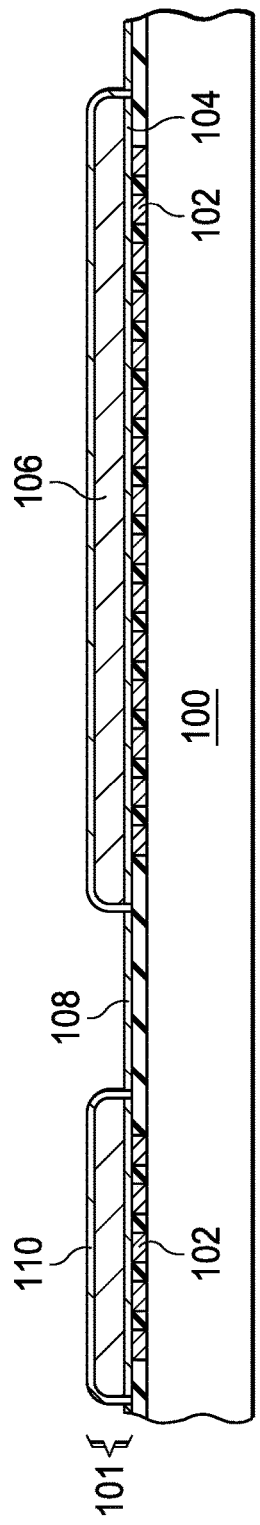
Figure 1D:
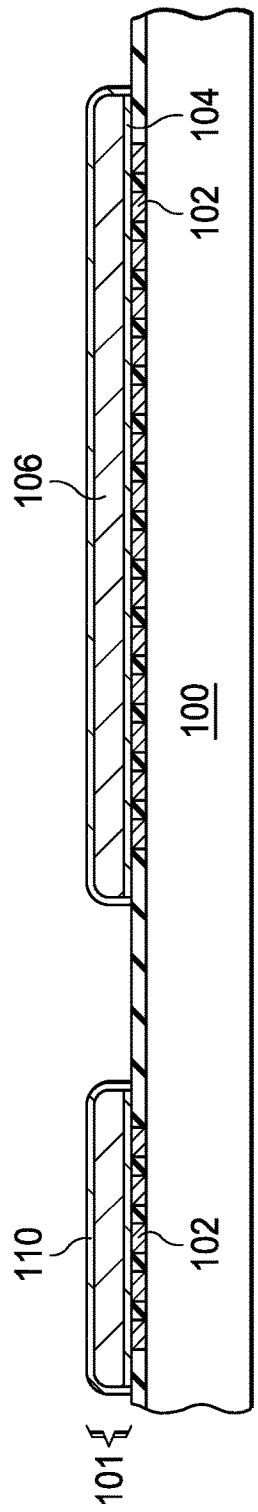

FIGS. 1A-1D depict an illustrative technique to coat a metal (e.g., copper) layer in a redistribution layer (RDL) with brass, in accordance with various examples. The technique begins with FIG. 1A, which depicts the provision of a die 100 (e.g., a semiconductor wafer or a portion thereof). A plurality of vias 102 facilitate communications between active circuitry on the die 100 and an RDL 101. The RDL 101 includes a seed layer 104 (e.g., titanium or titanium-tungsten) abutting a metal (e.g., copper) layer 106, as described in detail below. Configurations other than that shown in FIG. 1A are contemplated and included in the scope of this disclosure. FIG. 1B depicts the deposition of a zinc layer 108 on the metal layer 106. In FIG. 1B, the zinc layer 108 is deposited using a physical vapor deposition (PVD) technique, although other techniques are contemplated and included in the scope of this disclosure. The technique then comprises heating the metal layer 106 and the zinc layer 108 to form a brass layer 110, as FIG. 1C depicts. In some examples, a temperature ranging from 100 degrees Celsius to 900 degrees Celsius is applied. Because the formation of brass requires the presence of both copper and zinc, areas of the zinc layer 108 not abutting the metal (e.g., copper) layer 106 remain as zinc. These remaining areas of the zinc layer 108 are subsequently etched away, as FIG. 1D depicts.

Figure 2A:
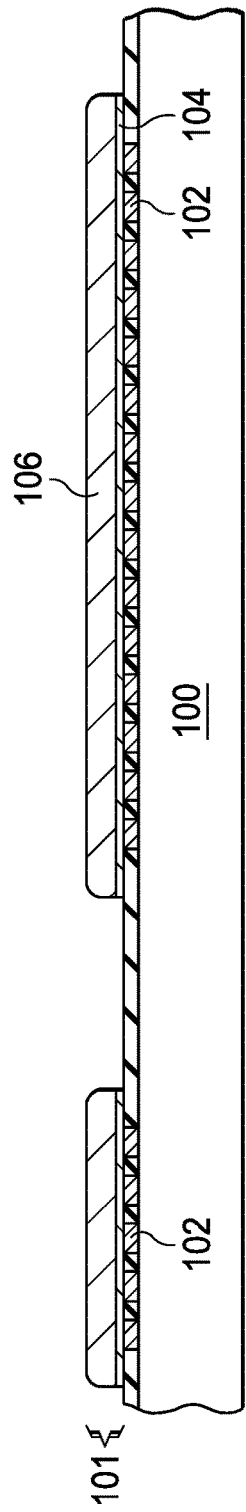
Figure 2B:
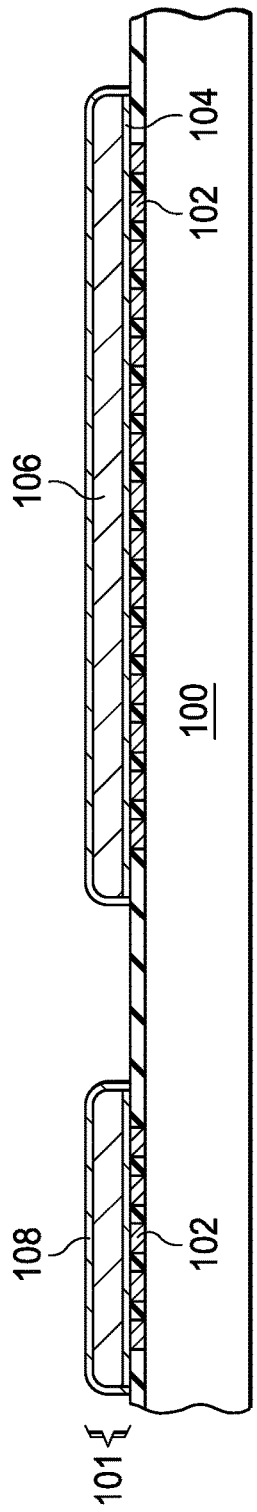

FIGS. 2A-2C depict an alternative technique to coat a metal (e.g., copper) layer in a redistribution layer (RDL) 101 with brass, in accordance with various examples. Similar to FIG. 1A, FIG. 2A depicts the provision of the die 100, the seed layer 104 (e.g., titanium or titanium-tungsten), and the metal (e.g., copper) layer 106. FIG. 2B depicts the addition of the zinc layer 108 using an immersion technique, although other techniques are contemplated and included in the scope of this disclosure. The metal layer 106 and the zinc layer 108 are heated as described above to form a brass layer 110, as FIG. 2C depicts.

In both FIGS. 1D and 2C, the brass layer 110 coats the metal layer 106, meaning that the brass layer 110 abuts the metal layer 106. A polymer (e.g., polyimide) layer is applied to the brass layer 110 as described in detail below, and in case the integrity of the polymer layer is compromised, the brass layer 110 protects the metal layer 106 from damage due to exposure to environmental influences such as moisture and temperature variations.

The remaining drawings, described in turn below, depict a variety of illustrative process flow techniques that may be used to fabricate RDLs in certain types of packages, such as flip-chip (e.g., wafer chip scale package (WCSP), ball grid array (BGA)) packages. Each of the process flow techniques described below may use the brass coating techniques described above with regard to FIGS. 1A-1D and 2A-2C. Although FIGS. 1A-1D and 2A-2C depict the use of dies having vias, the brass-coating techniques described above are not limited in application to such dies, and other dies also may be used, as described in detail below. FIG. 3A and following are now described in turn.

Figure 3C:
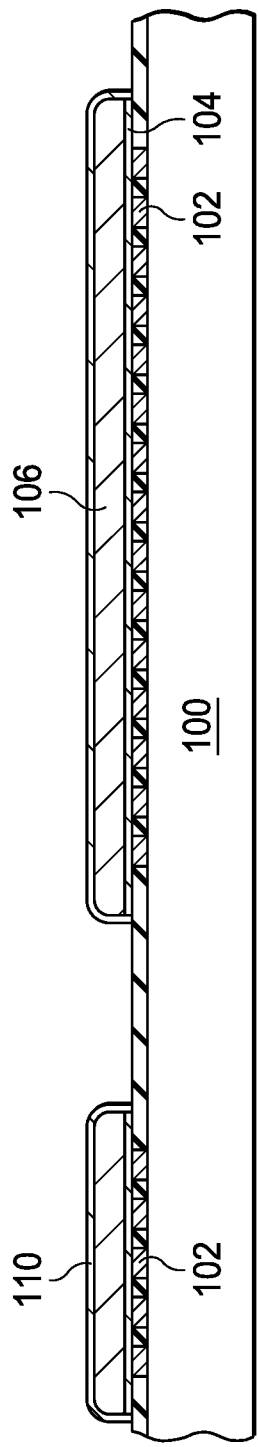

FIGS. 3A-3E depict an illustrative process flow technique to fabricate RDLs that include brass-coated metal layers, in accordance with various examples. FIG. 3A depicts a die 100 having a plurality of vias 102 to facilitate communications between active circuitry on the die 100 and the RDL to be fabricated on the die 100. The die 100 may be part of, or singulated from, a semiconductor wafer of any suitable type (e.g., silicon). The die 100 and the vias 102 may be fabricated using any suitable technique.

In FIG. 3B, a seed layer comprising a titanium/titanium-tungsten layer 104 and a metal (e.g., copper) layer 105 is deposited. In addition, a photoresist layer 300 is deposited on the metal layer 105, and the photoresist layer 300 is exposed using a mask and subsequently developed in a pattern so as to produce the structures depicted in FIGS. 3C-3E. For example, the photoresist layer 300 is exposed and developed in the pattern specifically depicted in FIG. 3B.

In FIG. 3C, either of the techniques described above for forming a brass-coated metal layer 106 (e.g., FIG. 1A-1D or 2A-2C) is used in tandem with the photoresist layer 300 to form a metal (e.g., copper) layer 106 and the brass layer 110. The photoresist layer 300 is removed, for example, using any suitable etching technique.

Figure 3D:
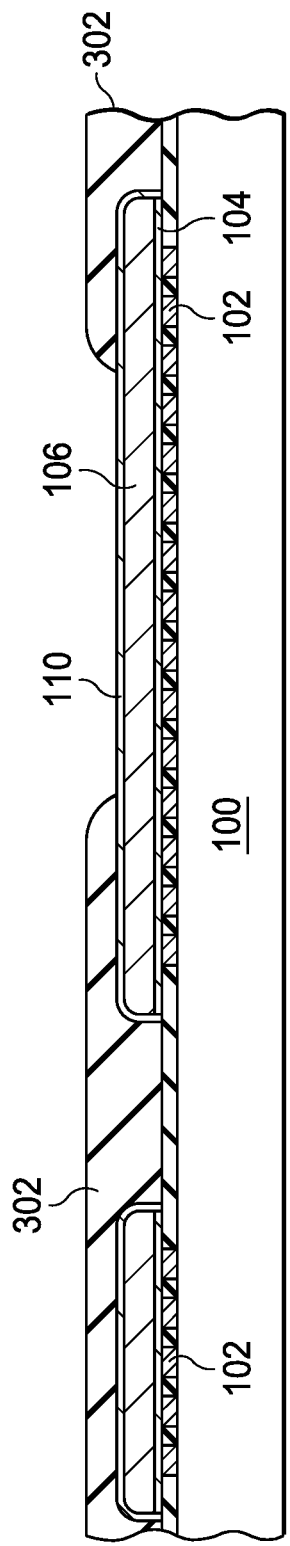

In FIG. 3D, a polymer (e.g., polyimide) layer 302 is deposited, exposed using a suitably-patterned mask, and subsequently developed to produce the final polymer layer 302 shown. In examples, the polymer layer 302 includes an orifice above a portion of the metal layer 106 and the brass layer 110, as shown.

Figure 3E:
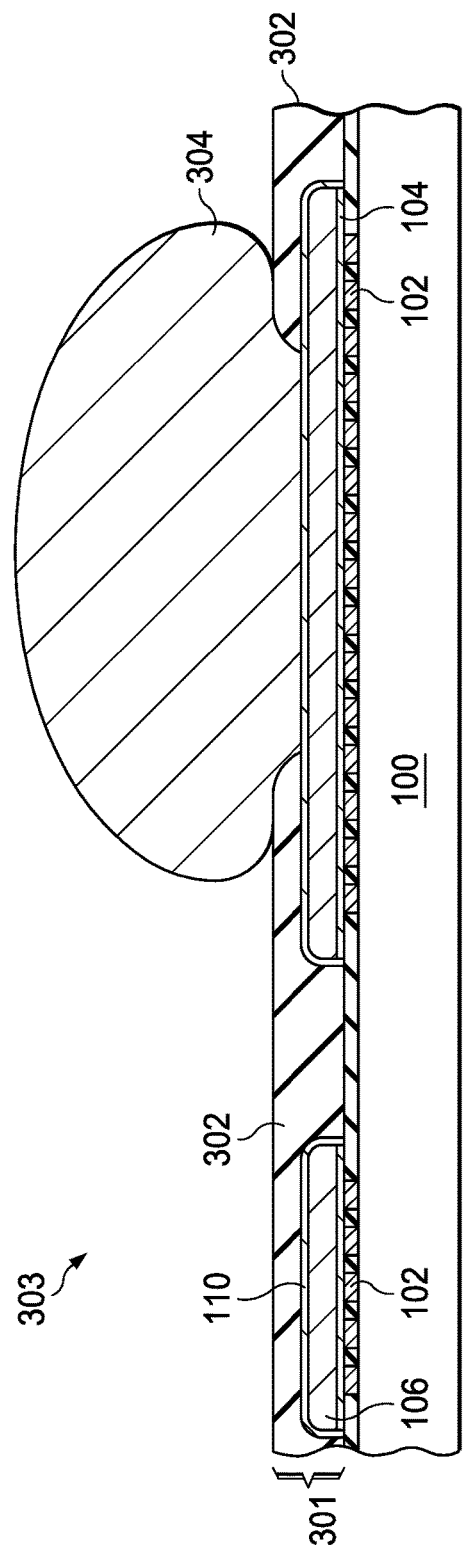

FIG. 3E represents a completed package 303. A solder ball 304 is dropped in the aforementioned orifice in the polymer layer 302. The solder ball 304 may be used to mount the die 100 and the RDL 301 to another electronic device, such as a printed circuit board (PCB). In some examples, the titanium/titanium-tungsten layer 104 has a thickness ranging from 500 A to 5000 A. This range of thicknesses is beneficial because a thicker seed layer can improve plating uniformity and reduce metal (e.g., copper) diffusion, while a thinner layer reduces costs. In some examples, the metal layer 106 has a thickness ranging from 2 microns to 30 microns. This range of thicknesses results in lower electrical resistance and higher conductivity when thicker, and reduces costs when thinner. In some examples, the brass layer 110 has a thickness ranging from 0.05 microns to 2 microns. The thicker end of this range improves protection of the metal (e.g., copper) layer, while a thinner brass layer 110 reduces costs. In some examples, the polymer layer 302 has a thickness ranging from 3 microns to 35 microns. This range of thicknesses is beneficial as a thicker polymer layer 302 is better for stress buffering, while a thinner layer can reduce costs.

FIGS. 4A-4G depict an illustrative process flow technique to fabricate RDLs that include brass-coated metal layers, in accordance with various examples. The discussion above with regard to FIGS. 3A-3D applies to FIGS. 4A-4D, respectively.

Figure 4A:
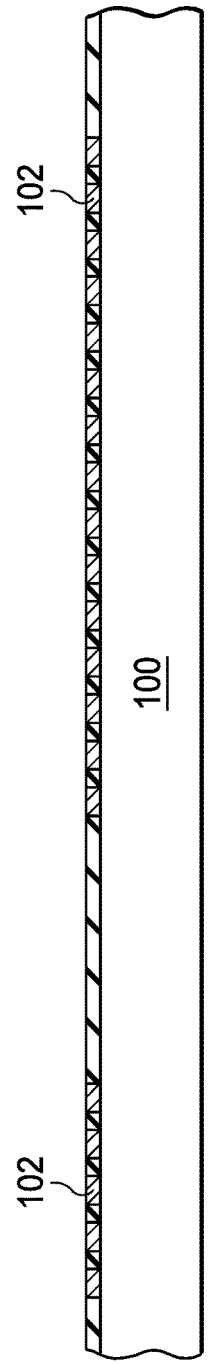
Figure 4B:
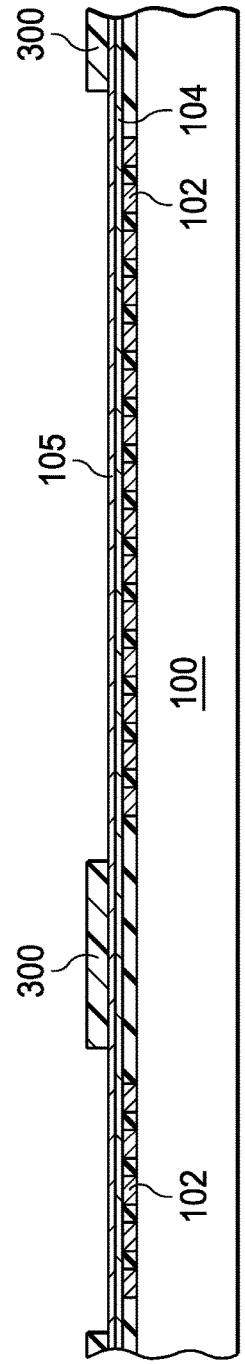
Figure 4C:
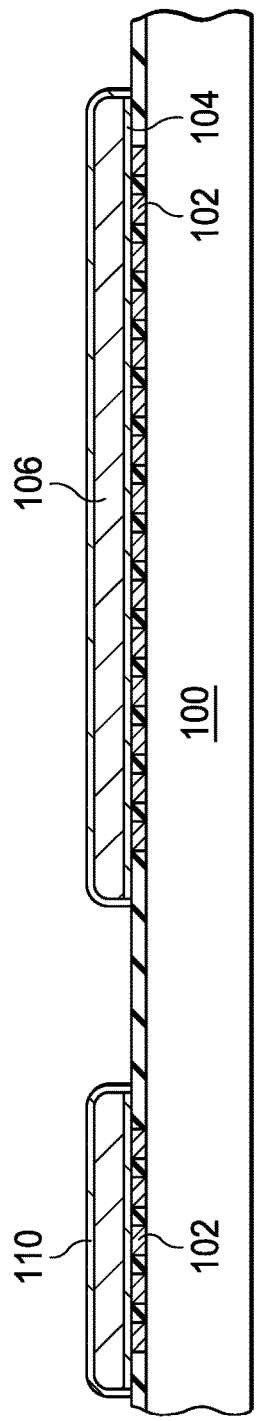
Figure 4D:
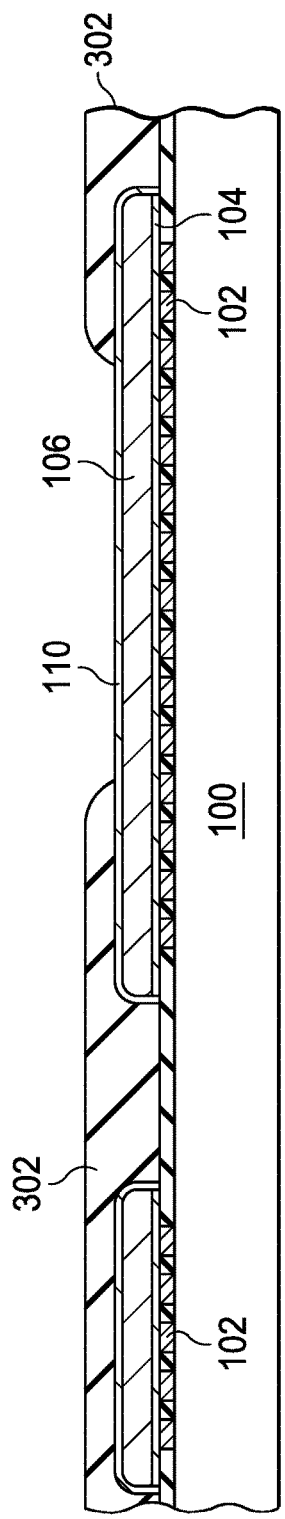
Figure 4E:
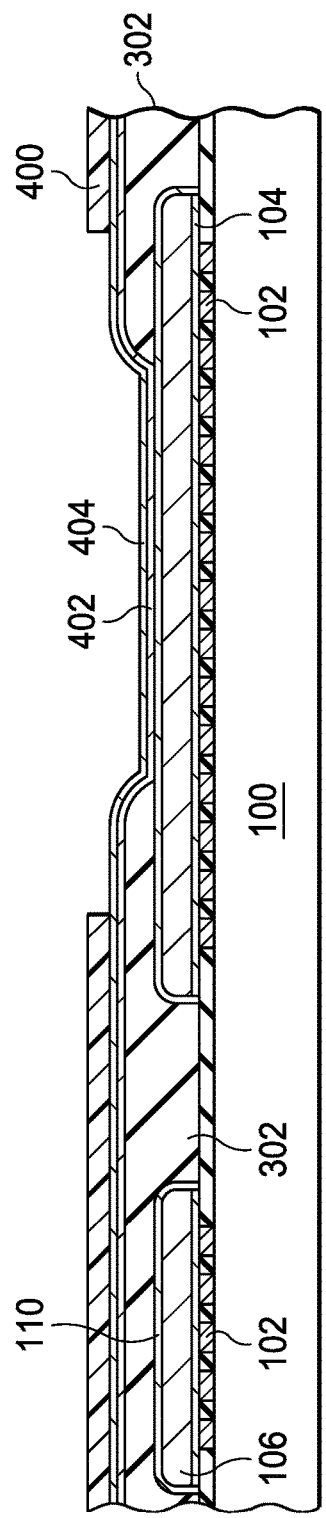

FIG. 4E depicts the deposition of a seed layer that includes a titanium/titanium-tungsten layer 402 and a metal layer 404. In addition, a photoresist layer 400 is deposited, exposed using a suitable mask, and developed to produce the pattern depicted in FIG. 4E.

In FIG. 4F, a plating process is performed to produce an under bump metallization (UBM) 406 in the area not covered by the photoresist layer 400 in FIG. 4E. The photoresist layer 400 and the seed layer (with the exception of the portion of the titanium/titanium-tungsten layer 402 beneath the UBM 406) are then etched away.

FIG. 4G represents a completed package 403. A solder ball 408 is dropped on the UBM 406, as shown. The solder ball 408 may be used to mount the die 100 and the RDL 401 to another electronic device, such as a PCB. In some examples, the titanium/titanium-tungsten layer 104 has the same range of thicknesses described above with respect to FIG. 3E. In some examples, the metal layer 106 has the same range of thicknesses as described above with respect to FIG. 3E. In some examples, the brass layer 110 has the same range of thicknesses as described above with respect to FIG. 3E. In some examples, the polymer layer 302 has the same range of thicknesses as described above. The benefits of the thicknesses for these various layers are similar to those described above with respect to FIG. 3E. In some examples, the UBM 406 has a range of thicknesses between 3 microns and 65 microns. These thicknesses are beneficial as a thicker layer mitigates electro-migration issues and a thinner layer reduces costs.

Figure 5A:
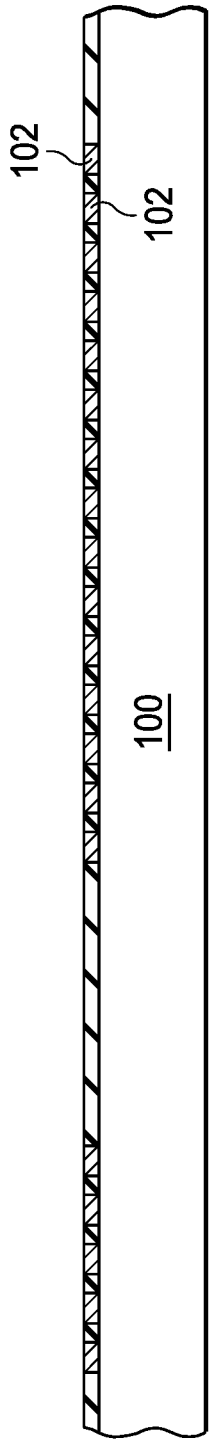
Figure 5B:
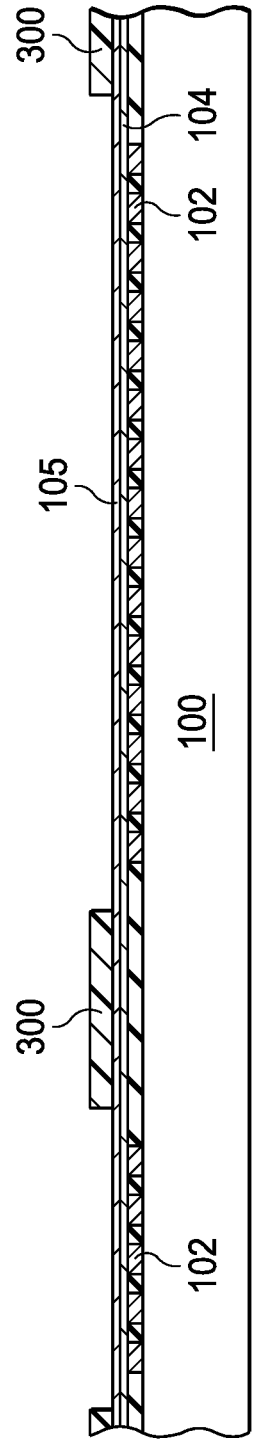
Figure 5C:
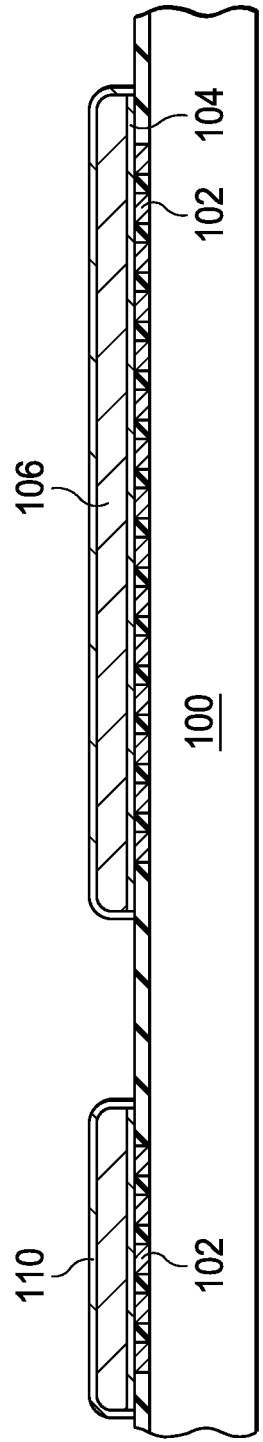
Figure 5D:
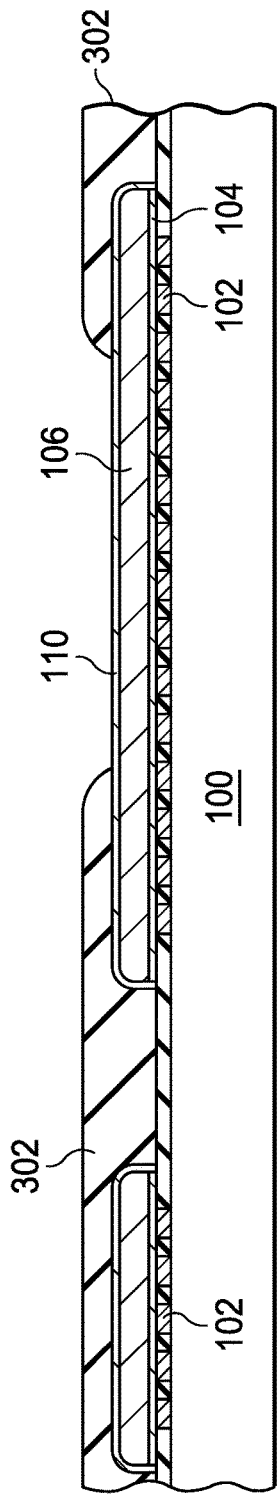
Figure 5E:
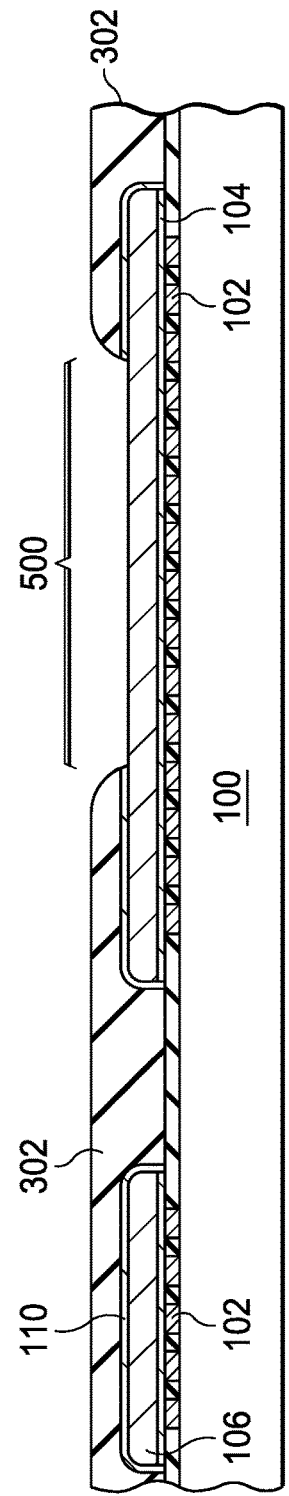
Figure 5F:
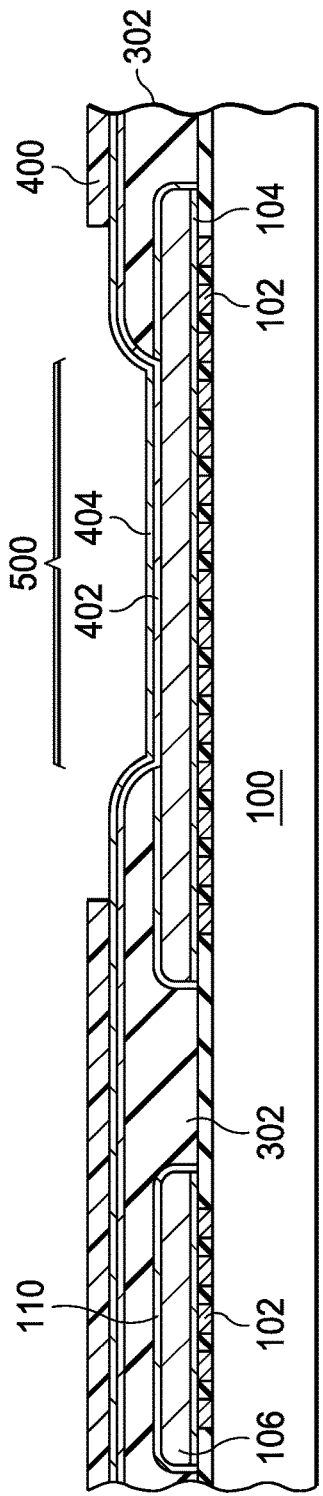

FIGS. 5A-5H depict an illustrative process flow technique to fabricate RDLs that include brass-coated metal layers, in accordance with various examples. FIGS. 5A-5D are identical to FIGS. 4A-4D, respectively, and the descriptions provided above for FIGS. 4A-4D thus also apply to FIGS. 5A-5D, respectively. In FIG. 5E, a portion 500 of the brass layer 110 is etched away using any suitable etching technique. The actions depicted in FIGS. 5F-5H are identical to those depicted in FIGS. 4E-4G, respectively, and thus the descriptions provided above for FIGS. 4E-4G also apply to FIGS. 5F-5H, respectively. The final package 503 shown in FIG. 5H, which includes the RDL 501, is identical to that in FIG. 4G except that a portion (e.g., the portion 500 depicted in FIG. 5E) of the brass layer 110 is removed. The removal of this portion of the brass layer in the example of FIGS. 5A-5H may be beneficial because it may improve contact resistance of the UBM 406 to the metal layer 106.

Figure 6B:
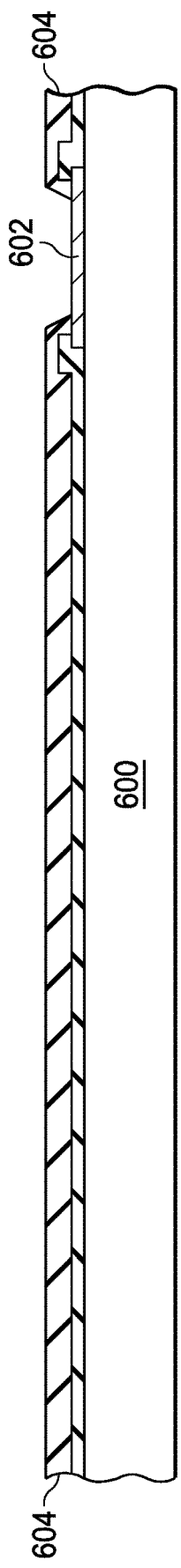

FIGS. 6A-6F depict an illustrative process flow technique to fabricate RDLs that include brass-coated metal layers, in accordance with various examples. FIG. 6A depicts the provision of a die 600 having a bond pad 602. The bond pad 602 facilitates communications between an RDL (described below) and active circuitry of the die 600. The die 600 may be singulated from, or be part of, a semiconductor wafer of any suitable type.

In FIG. 6B, a polymer (e.g., polyimide) layer 604 is deposited, exposed using a suitable mask, and developed to produce the illustrative pattern shown. In examples, the photolithography technique used produces an orifice above the bond pad 602, as shown.

Figure 6C:
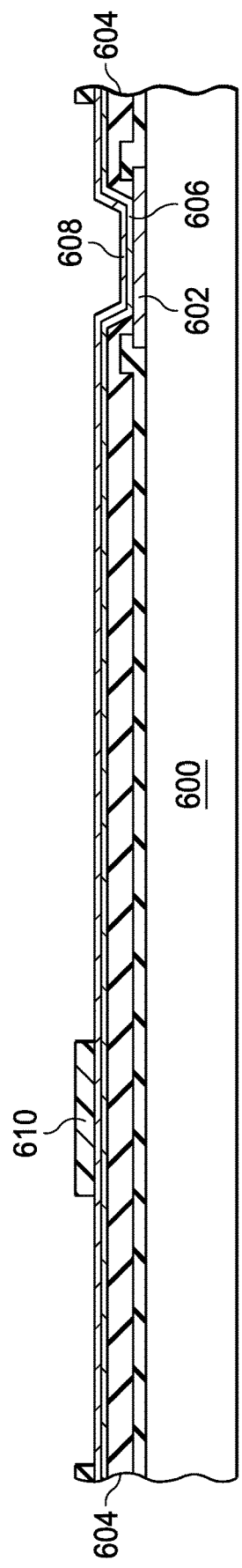

In FIG. 6C, a seed layer including a titanium/titanium-tungsten layer 606 and a metal (e.g., copper) layer 608 is deposited on the polymer layer 604. In addition, a photoresist layer 610 is deposited, exposed using a suitably patterned mask, and developed to produce the photoresist pattern depicted in FIG. 6C.

Figure 6D:
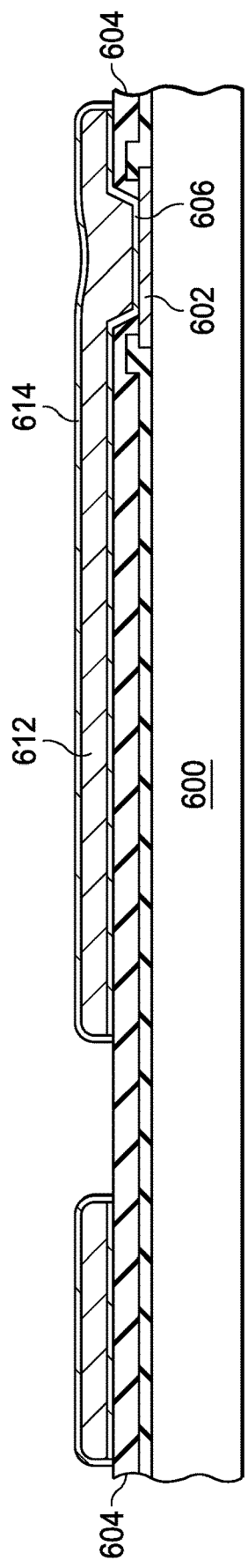

In FIG. 6D, the photoresist layer 610 of FIG. 6C is used to plate a metal (e.g., copper) layer 612. In addition, a brass layer 614 is formed using, e.g., one of the techniques described above with respect to FIG. 1A-1D or 2A-2C. The photoresist layer 610, the metal layer 608, and portions of the titanium/titanium-tungsten layer 606 not below the metal layer 612 are etched away using any suitable etching technique.

Figure 6E:
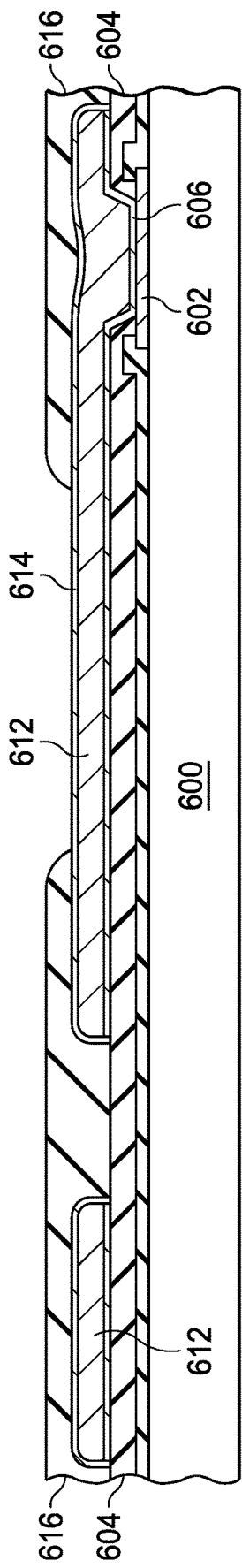

In FIG. 6E, another polymer layer 616 is deposited, exposed, and developed to form the pattern shown. An orifice in the polymer layer 616 exposes the brass layer 614, as shown.

Figure 6F:
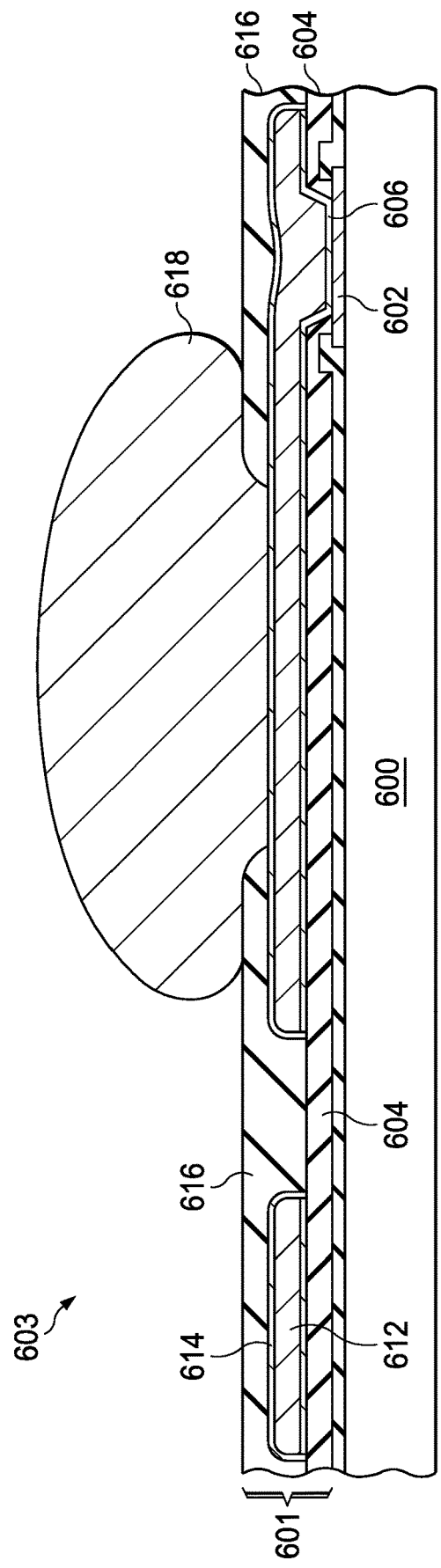

FIG. 6F depicts a completed package 603 with the die 600, an RDL 601, and a solder ball 618 dropped on the exposed brass layer 614, as shown. The solder ball 618 may be used to mount the package 603 to another electronic device, such as a PCB. An electrical pathway may thus be established between the active circuitry on the die 600 and the electronic device to which the solder ball 618 couples. In some examples, the polymer layer 604 has a thickness ranging from 3 microns to 35 microns, with a thicker polymer layer 604 providing a better stress buffer and a thinner layer reducing cost. In some examples, the titanium/titanium-tungsten layer 606, metal layer 612, and brass layer 614 have similar thicknesses as the corresponding layers described above with respect to any of the foregoing figures. In some examples, the polymer layer 616 has a thickness ranging from 3 microns to 35 microns, which may be beneficial because a thicker layer improves stress buffering while a thinner layer can reduce cost.

Figure 7A:
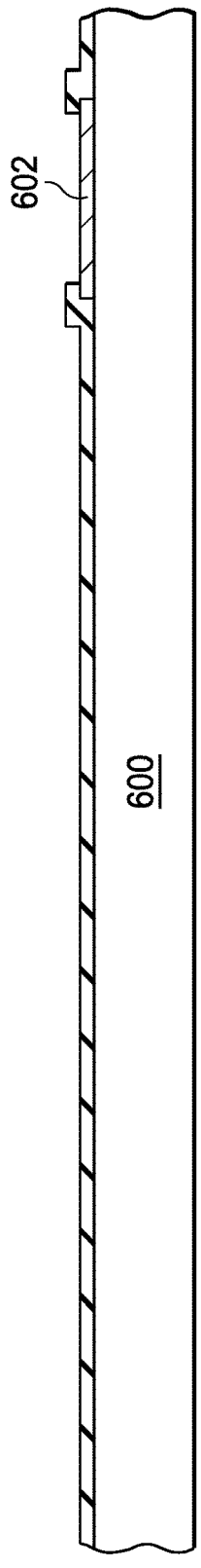
Figure 7B:
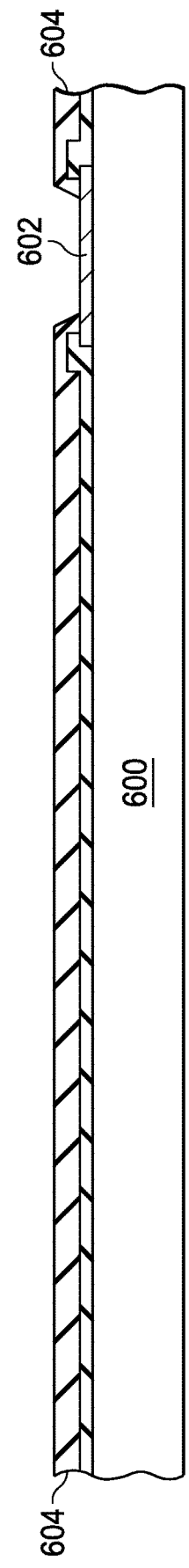
Figure 7C:
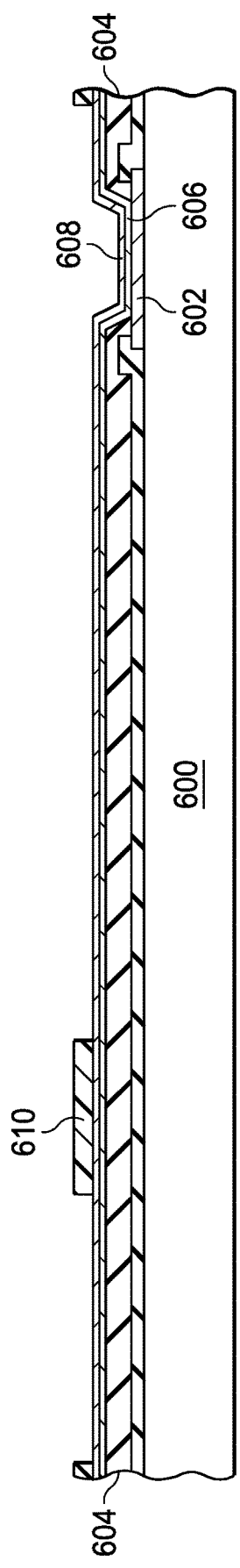

FIGS. 7A-7H depict an illustrative process flow technique to fabricate RDLs that include brass-coated metal layers, in accordance with various examples. FIGS. 7A-7E are identical to FIGS. 6A-6E, respectively. FIG. 7F includes the deposition of a seed layer including a titanium/titanium-tungsten layer 620 and a metal (e.g., copper) layer 622. FIG. 7F also depicts a photoresist layer 624 after deposition, exposure using a suitably patterned mask, and development.

Figure 7G:
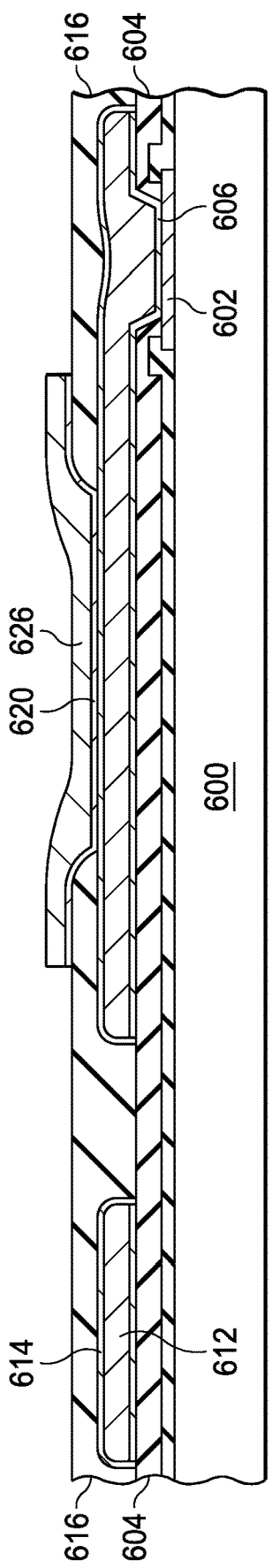

In FIG. 7G, a UBM 626 is plated on the areas not covered by the photoresist layer 624. In addition, the photoresist layer 624 is etched away using any suitable etching process, as is the seed layer (with the exception of the portion of the titanium/titanium-tungsten layer 620 below the UBM 626).

Figure 7H:
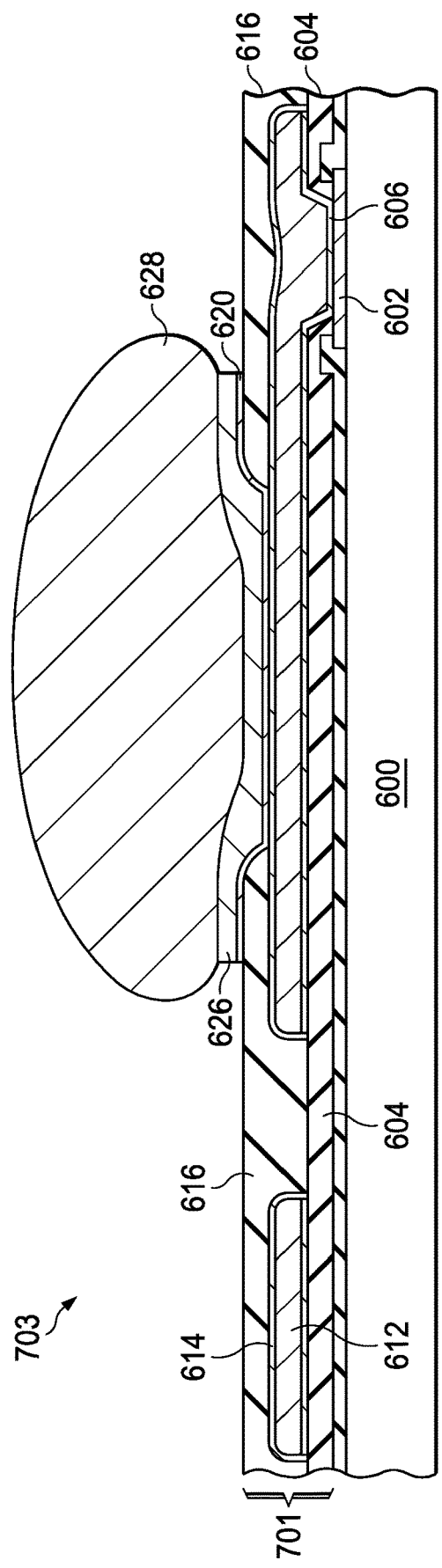
Figure 8A:
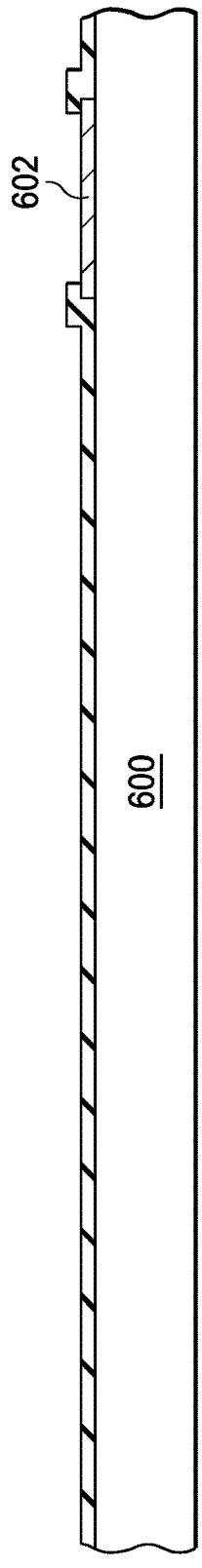
FIGS. 8A-8H depict an illustrative process flow technique to fabricate RDLs that include brass-coated copper layers, in accordance with various examples.
Figure 8B:
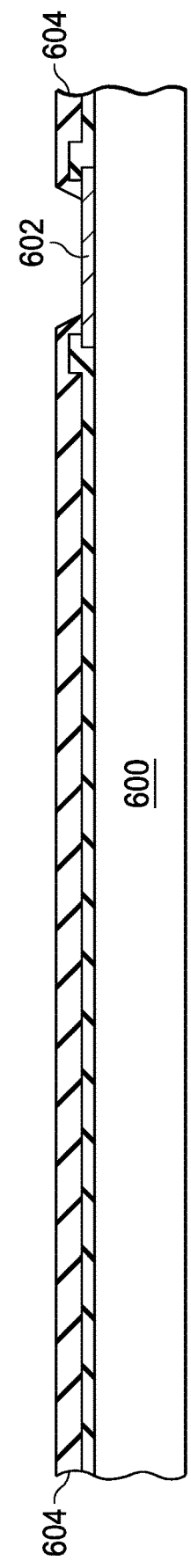
Figure 8C:
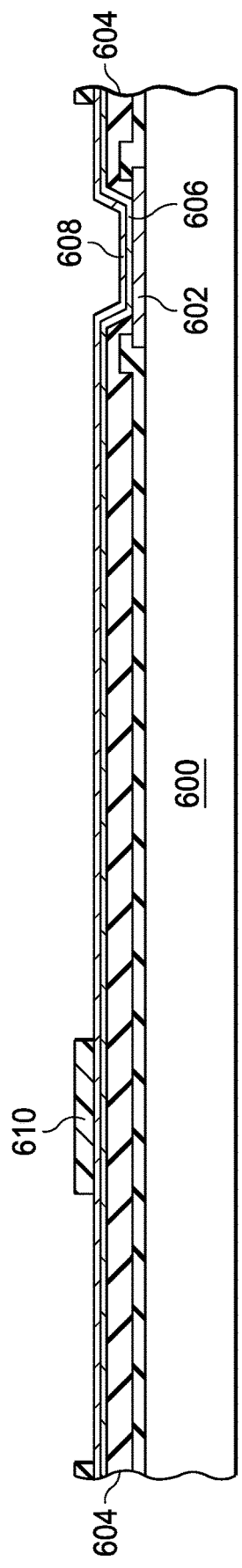
Figure 8D:
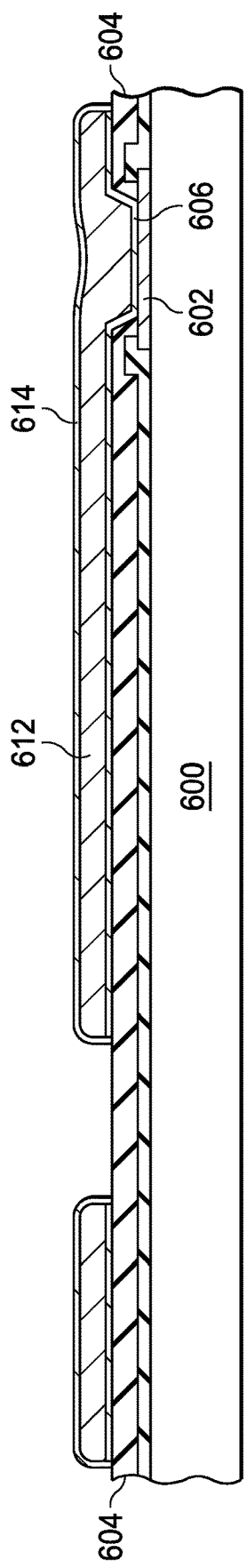
Figure 8E:
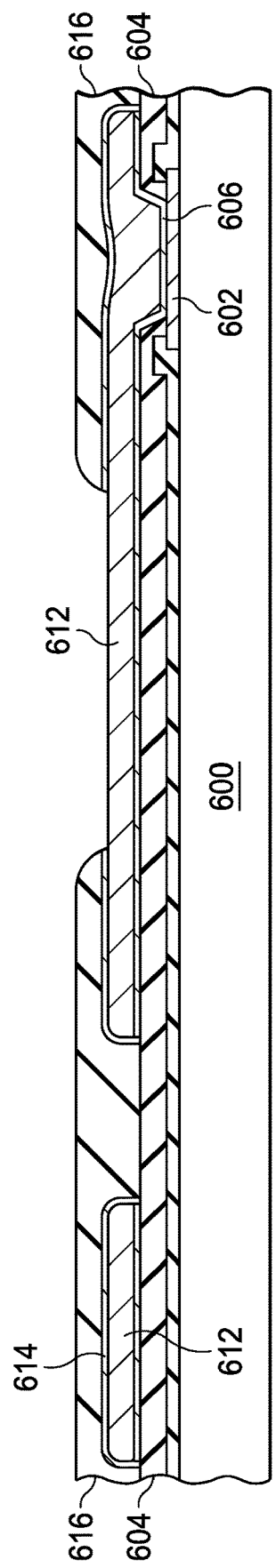
Figure 8F:
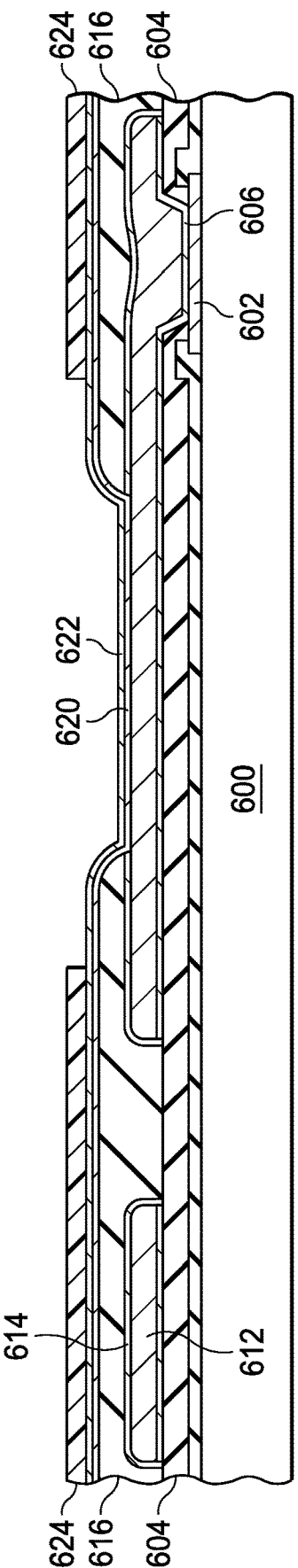
Figure 8G:
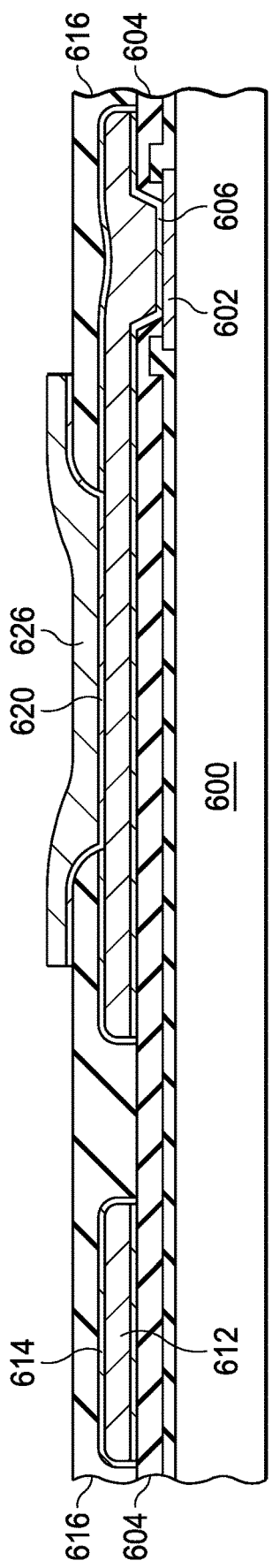
Figure 8H:
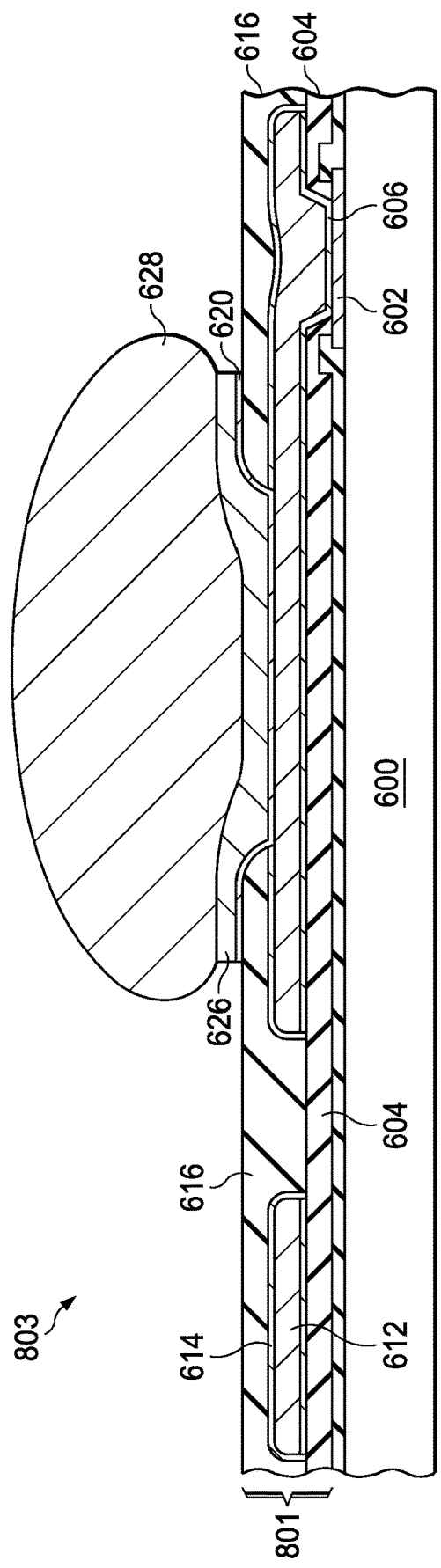

FIG. 7H depicts a complete package 703, including the die 600, RDL 701, and solder ball 628 dropped on the UBM 626. The solder ball 628 may be used to mount the package 703 to another electronic device, such as a PCB. In this manner, active circuitry on the die 600 communicates with the electronic device via the RDL 701 and the solder ball 628. The dimensions of the various layers in the package 703 may be similar to those described above with respect to FIG. 6F, with the exception of the UBM 626, which may have dimensions similar to those of the UBM 406 in FIG. 5H, for example. The criticalities of these dimensions may also be the same or similar as those given above.

FIGS. 8A-8H depict an illustrative process flow technique to fabricate RDLs that include brass-coated metal layers, in accordance with various examples. FIGS. 8A-8H are identical to FIGS. 7A-7H, respectively, except that in FIGS. 8E-8H, the portion 805 of the brass layer 614 is etched away. Etching away this portion of the brass layer 614 can be beneficial because it improves contact resistance of the UBM 626 to the metal layer 612. The dimensions of the various layers in the package 803 of FIG. 8H, including the RDL 801, are similar to those described with respect to FIG. 7H. Similarly, the criticalities of these dimensions are also the same as those described with respect to FIG. 7H.

Figure 9D:
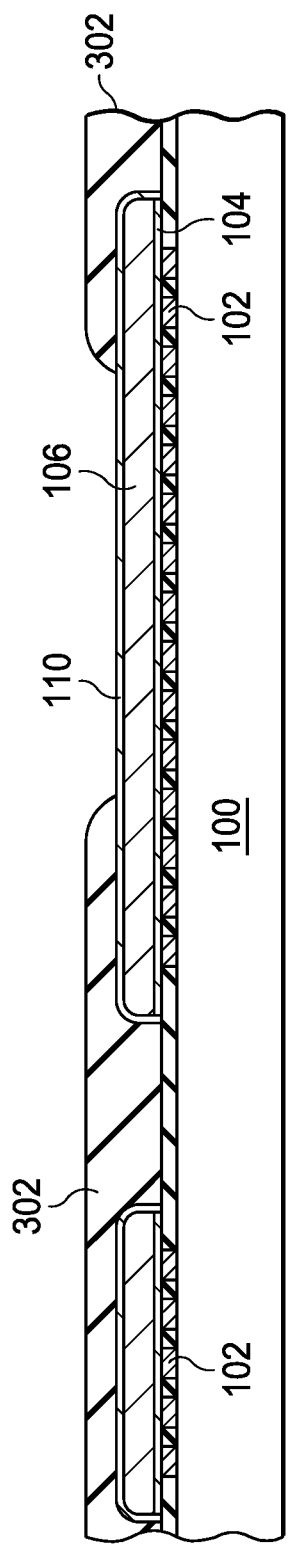
Figure 9E:
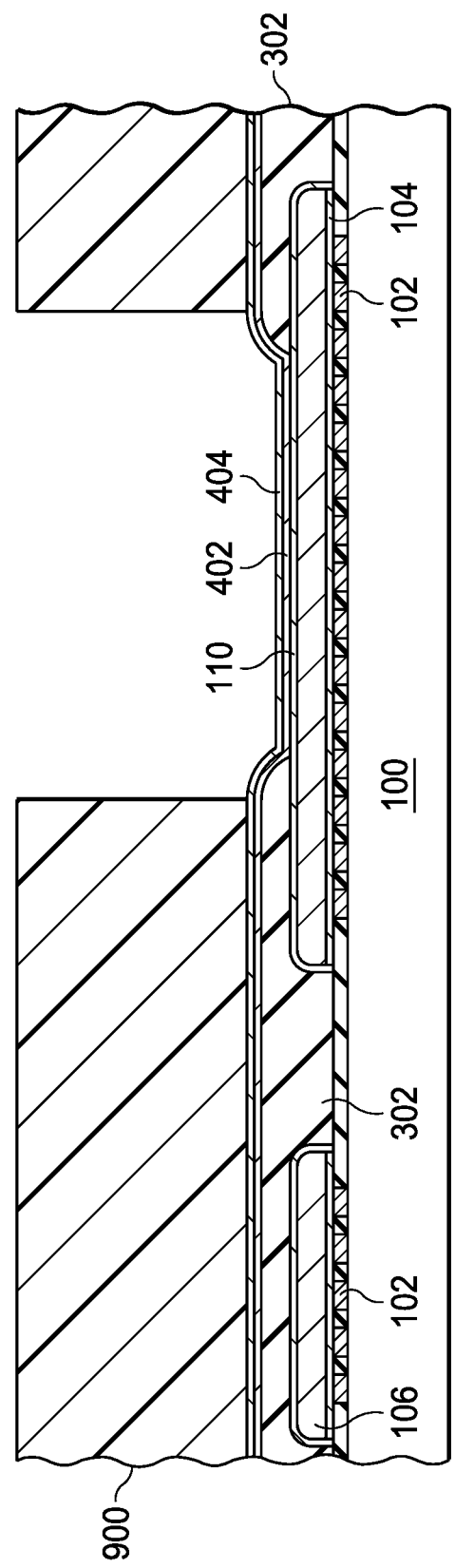
Figure 9F:
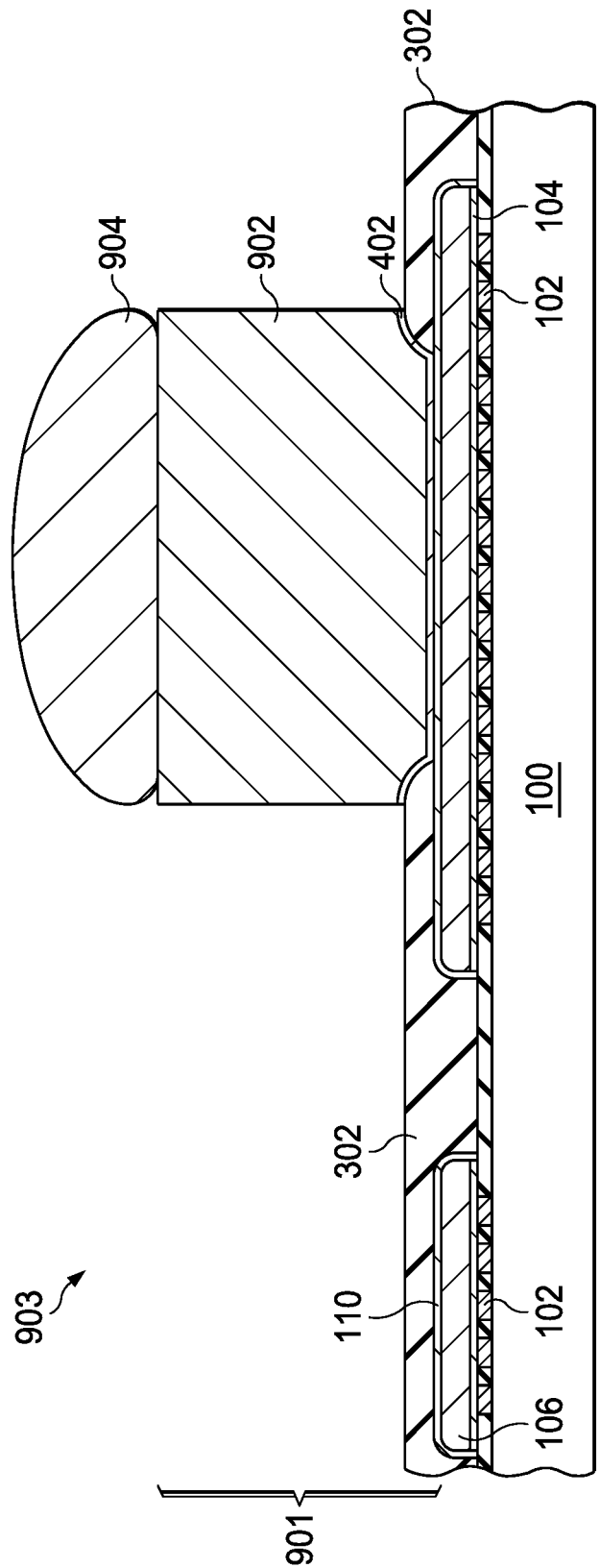

FIGS. 9A-9F depict an illustrative process flow technique to fabricate RDLs that include brass-coated metal layers, in accordance with various examples. FIGS. 9A-9D are identical to FIGS. 4A-4D, respectively, and thus the description provided above for FIGS. 4A-4D also applies for FIGS. 9A-9D, respectively. In FIG. 9E, a seed layer including a titanium/titanium-tungsten layer 402 is applied, followed by a metal (e.g., copper) layer 404. In addition, a photoresist layer 900 is applied, followed by an exposure and development of the photoresist layer 900 in the pattern shown. As FIG. 9F depicts, the metal layer 404 is then plated to form a pillar 902 (e.g., a copper pillar). In addition, the photoresist layer 900 and the portions of the seed layer not located under the pillar 902 are etched away using any suitable etching technique. FIG. 9F also depicts a solder ball 904 having been dropped on a top surface of the pillar 902. The package 903 depicted in FIG. 9F, including the RDL 901, may then be mounted to another electronic device, such as a PCB. In this manner, active circuitry on the die 100 may communicate with the electronic device via the RDL 901 and the solder ball 904. The dimensions of the various layers in the RDL 901 are similar to those described above with respect to FIG. 4G, with the exception of the pillar 902. In some examples, the pillar 902 has a thickness ranging from 10 microns to 150 microns. A thicker pillar 902 mitigates electro-migration issues and improves stress buffering, while a thinner layer improves cost.

Figure 10A:
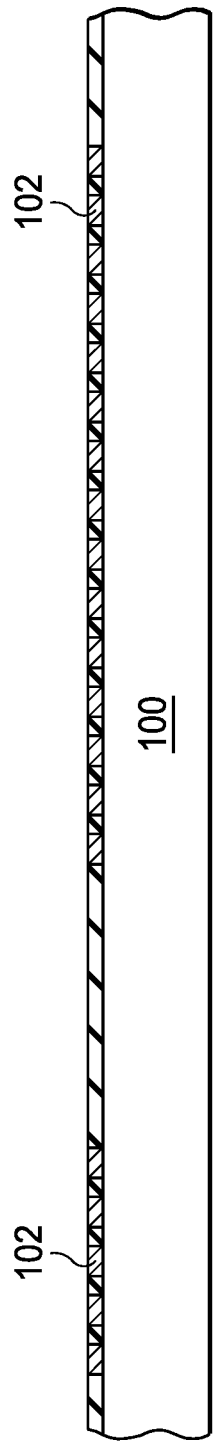
Figure 10B:
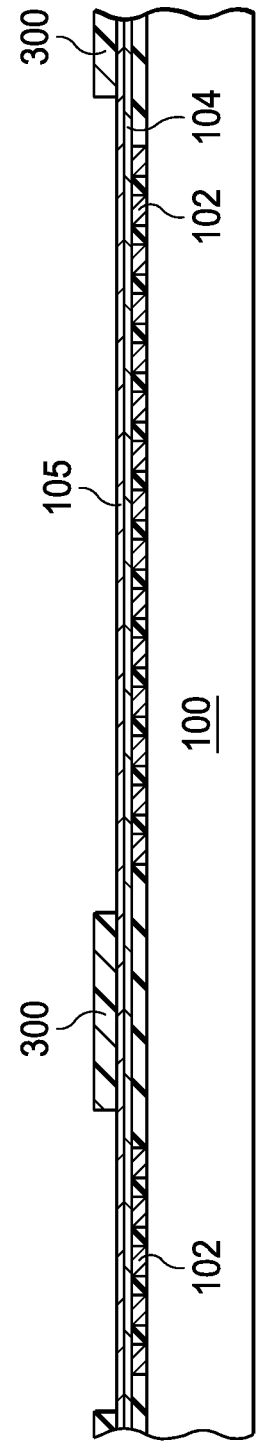
Figure 10C:
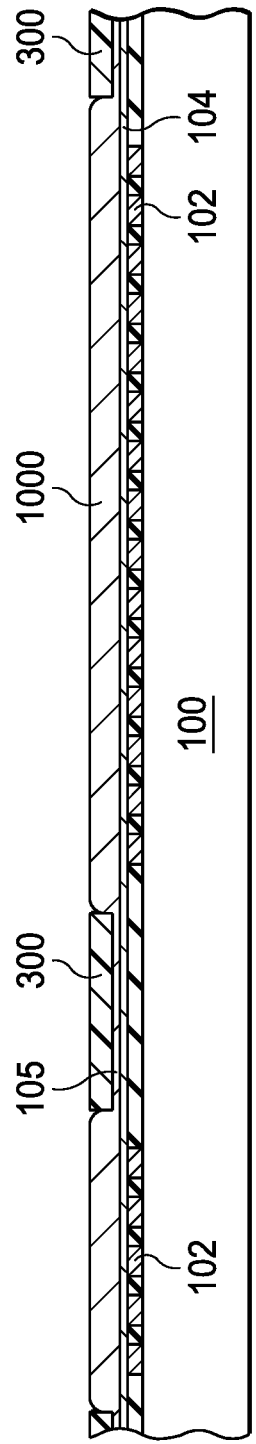
Figure 10D:
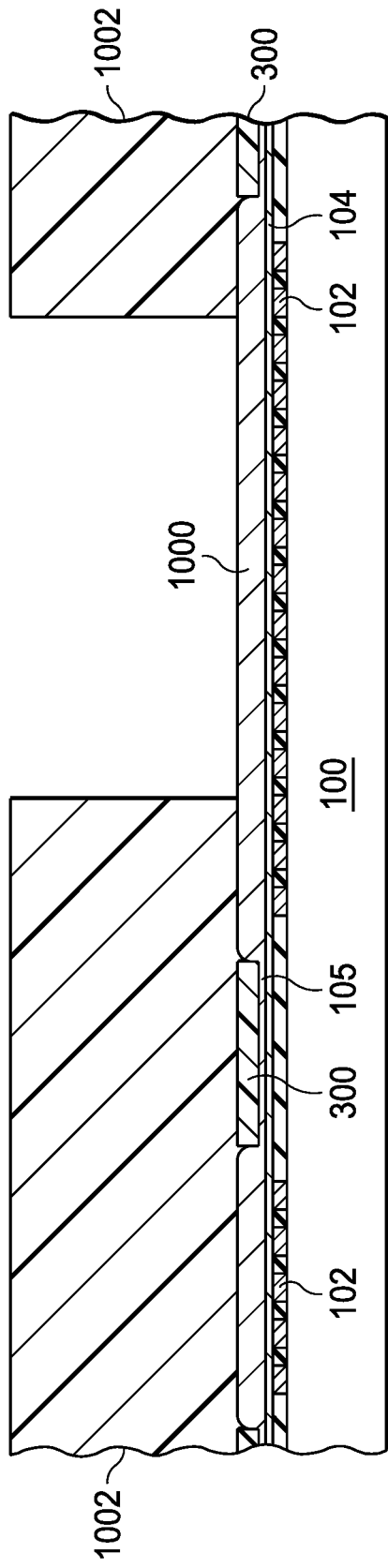
Figure 10E:
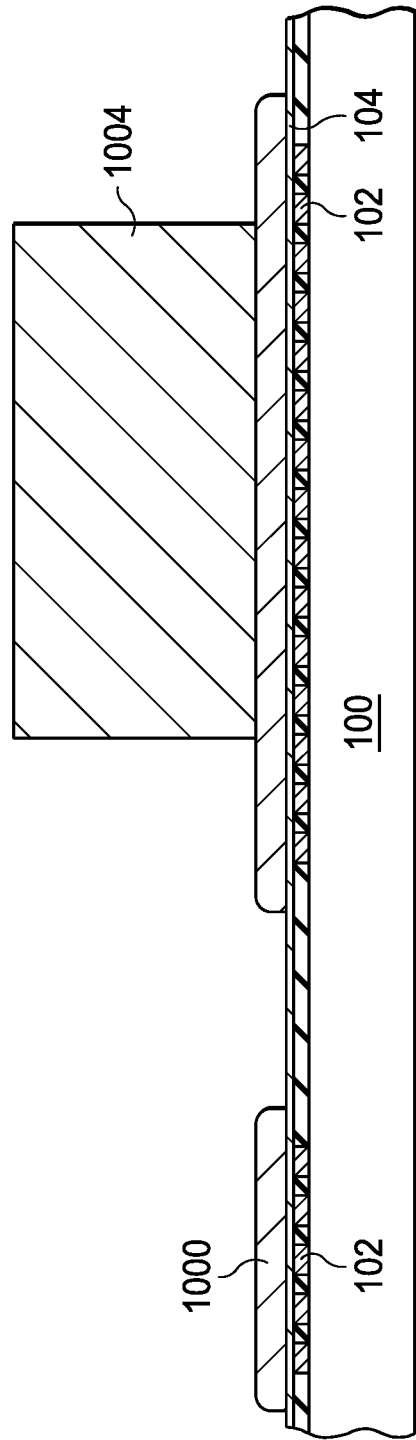

FIGS. 10A-10G depict an illustrative process flow technique to fabricate RDLs that include brass-coated metal layers, in accordance with various examples. In FIG. 10A, a die 100 with vias 102 is provided, where the die 100 is part of, or is singulated from, a semiconductor wafer of any suitable type. In FIG. 10B, a seed layer comprising a titanium/titanium-tungsten layer 104 and a metal (e.g., copper) layer 105 is deposited. In addition, a photoresist layer 300 is deposited, exposed using a suitable mask, and developed on the metal layer 105 in the pattern shown. In FIG. 10C, the metal layer 105 is plated to grow a metal (e.g., copper) layer 1000. In some examples, the metal layer 105 is plated such that the metal layer 1000 has a thickness that is approximately equal to the thickness of the photoresist layer 300. In FIG. 10D, a photoresist layer 1002 is deposited, exposed, and developed to produce the pattern shown. In FIG. 10E, the metal layer 1000 is plated to produce a metal (e.g., copper) pillar 1004. In addition, the photoresist layer 1002 and the exposed areas of the seed layer are etched away using any suitable etching technique. In FIG. 10F, a brass layer 1006 is formed, for example, using any of the techniques described above with respect to FIG. 1A-1D or 2A-2C. In FIG. 10G, a polymer layer 1010 (e.g., polyimide) is deposited as shown, and a solder ball 1008 is dropped on the top surface of the pillar 1004. In some examples, the solder ball 1008 is dropped on the portion of the brass layer 1006 on the top surface of the pillar 1004. In some examples, the portion of the brass layer 1006 on the top surface of the pillar 1004 is removed (e.g., using a surface planarization technique), and the solder ball 1008 is subsequently dropped on the top surface of the pillar 1004. In some examples, the polymer layer 1010 has a thickness ranging from 3 microns to 35 microns. This range may be beneficial because a thicker layer provides improved stress buffering while a thinner layer improves costs. In some examples, the pillar 1004 has a thickness ranging from 10 microns to 150 microns. This range of thicknesses may be beneficial because a thicker pillar is better for electro-migration and stress buffering, while a thinner pillar improves costs. The completed package 1003 in FIG. 10G, including the RDL 1001, may be mounted on another electronic device, such as a PCB, using the solder ball 1008. In this way, communications may occur between the electronic device and active circuitry on the die 100. In some examples, the top surface of the pillar 1004 retains its brass coating, producing a structure identical to that of FIG. 10G but including the brass layer 1006 on top of the pillar 1004 (and under the solder ball 1008) as well.

Figure 11D:
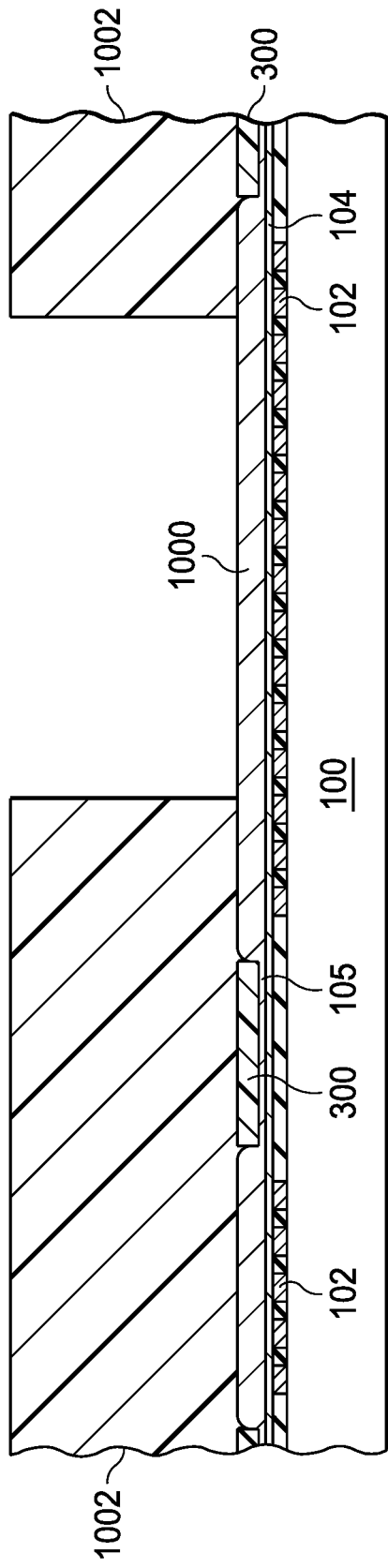
Figure 11E:
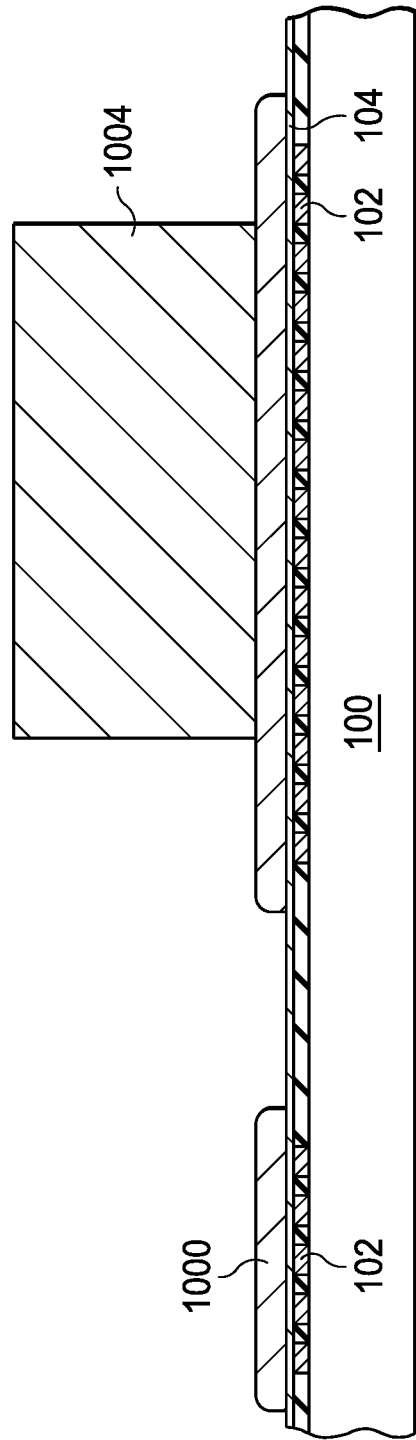
Figure 11H:
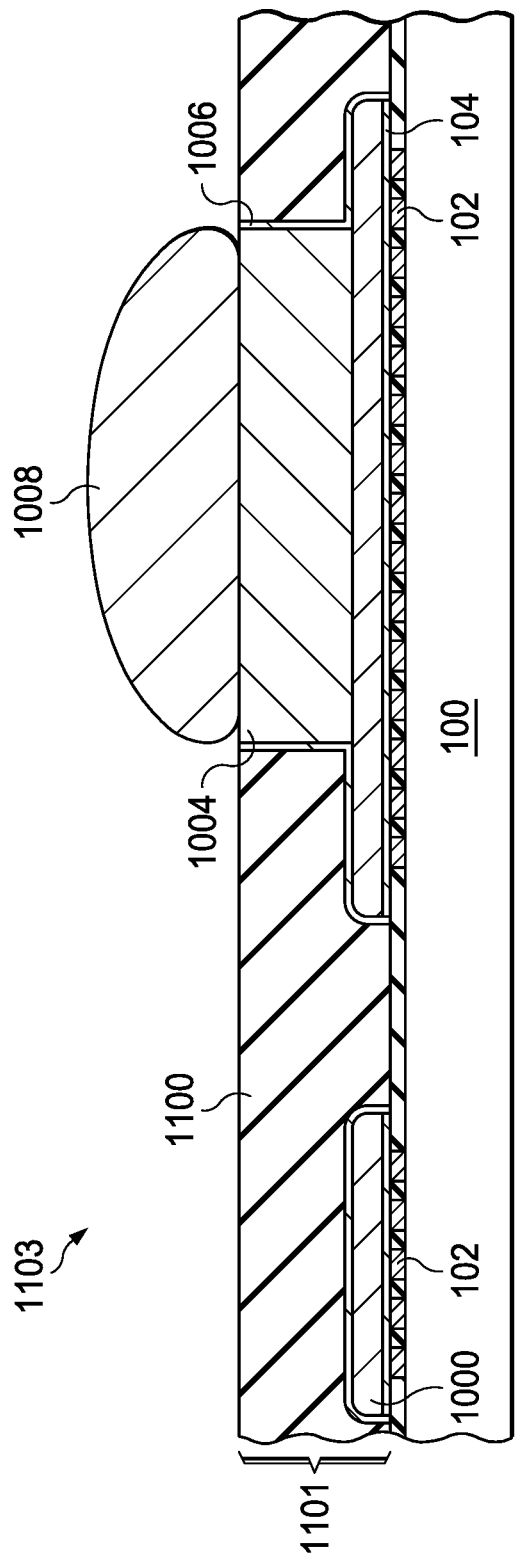

FIGS. 11A-11H depict an illustrative process flow technique to fabricate RDLs that include brass-coated copper layers, in accordance with various examples. FIGS. 11A-11F are identical to FIGS. 10A-10F, respectively. In FIG. 11G, a polymer layer 1100 (e.g., polyimide) is applied at an illustrative thickness ranging from 3 microns to 150 microns. In addition, in FIG. 11G, the portion of the brass layer 1006 on the top surface of the pillar 1004 may be removed, for example using a surface planarization technique. In FIG. 11H, the polymer layer 1100 and the pillar 1004 are reduced in thickness using any suitable planarization technique, for example to an illustrative thickness ranging from 10 microns to 100 microns. A solder ball 1008 may subsequently be dropped on the top surface of the pillar 1004, whether directly on the metal (e.g., copper) of the pillar 1004 or on the brass layer 1006 covering the top surface of the pillar 1004. The package 1103 of FIG. 11H, including the RDL 1101, may then be mounted to another electronic device, such as a PCB. In this manner, electronic communications may occur between the active circuitry on the die 100 and the electronic device. In some examples, a mold compound may be used in lieu of the polymer layer 1100. In some examples, the thickness of the pillar 1004 in the completed package 1103 of FIG. 11H may range from 10 microns to 150 microns. Benefits of such a range may include improved electro-migration and stress buffering with thicker values, and reduced costs with thinner values. In some examples, the thickness of the polymer layer (or mold compound layer) 1100 may range from 10 microns to 150 microns. In some examples, in the step of FIG. 11D, a second seed layer (including additional titanium/titanium-tungsten and copper layers) may be deposited on the metal layer 1000, and the copper layer of the second seed layer may be plated to produce the pillar 1004. In such examples, the final structure is identical to that shown in FIG. 11H, but with a titanium/titanium-tungsten layer separating the pillar 1004 from the metal layer 1000. In such examples, other materials, such as mold compounds, may be used in lieu of the polymer layer 1100.

The foregoing description refers to numerous drawings that represent steps of process flows. Any of the structures depicted in any step of any process flow described above and/or depicted in the drawings may be incorporated into a completed product. For example, the structures depicted in FIGS. 4D, 5E, 6E, and/or 8E may be incorporated into a completed, manufactured product.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method for manufacturing a package, comprising:
positioning a copper layer above a die;
positioning a zinc layer on the copper layer;
heating the zinc and copper layers to produce a brass layer, the brass layer abutting the copper layer; and
positioning a polymer layer abutting the brass layer.

2. The method of claim 1, wherein positioning the zinc layer on the copper layer comprises using physical vapor deposition to deposit the zinc layer on the copper layer.

3. The method of claim 1, wherein positioning the zinc layer on the copper layer comprises using an immersion technique to deposit the zinc layer on the copper layer.

4. The method of claim 1, wherein heating the zinc and copper layers includes heating at a temperature ranging from 100 degrees Celsius to 900 degrees Celsius.

5. The method of claim 1 further comprising etching areas of the zinc layer not abutting the copper layer.

6. The method of claim 1 further comprising patterning the polymer layer to create an orifice that exposes a portion of the brass layer.

7. The method of claim 6 further comprising dropping a solder ball in the orifice abutting the polymer layer and the brass layer, the solder ball electrically connected to the die.

8. The method of claim 6 further comprising plating over the orifice to create an under bump metallization layer and then dropping a solder ball on the under bump metallization layer.

9. The method of claim 1, wherein prior to positioning a copper layer above a die, depositing a seed layer comprising a titanium/titanium-tungsten layer on the die.

10. The method of claim 9, wherein the titanium/titanium-tungsten layer has a thickness ranging from 500 A to 5000 A.

11. The method of claim 1, wherein the copper layer has a thickness ranging from 2 microns to 30 microns.

12. The method of claim 1, wherein the brass layer has a thickness ranging from 0.05 microns to 2 microns.

13. The method of claim 1, wherein the polymer layer has a thickness ranging from 3 microns to 35 microns.

* * * * *